US012641776B2

(12) United States Patent
Uhm et al.

(10) Patent No.: US 12,641,776 B2
(45) Date of Patent: May 26, 2026

(54) SEMICONDUCTOR DEVICE INCLUDING CHANNEL PATTERN AND METHOD FOR MANUFACTURING THE SAME

(71) Applicant: Samsung Electronics Co., Ltd., Suwon-si (KR)

(72) Inventors: Sanghoon Uhm, Suwon-si (KR); Min Hee Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 497 days.

(21) Appl. No.: 18/362,998

(22) Filed: Aug. 1, 2023

(65) Prior Publication Data

US 2024/0276710 A1 Aug. 15, 2024

(30) Foreign Application Priority Data

Feb. 9, 2023 (KR) ........................ 10-2023-0017328

(51) Int. Cl.
H10B 12/00 (2023.01)

(52) U.S. Cl.
CPC ........... H10B 12/482 (2023.02); H10B 12/05 (2023.02); H10B 12/315 (2023.02); H10B 12/488 (2023.02)

(58) Field of Classification Search
CPC ........ H10B 12/00; H10B 12/30; H10B 63/84; H10B 12/485
See application file for complete search history.

(56) References Cited

U.S. PATENT DOCUMENTS

| | | |
|---|---|---|
| 8,618,543 B2 | 12/2013 | Lee et al. |
| 10,396,140 B2 | 8/2019 | Kim et al. |
| 11,276,613 B2 | 3/2022 | Torek |

(Continued)

FOREIGN PATENT DOCUMENTS

JP 2008166442 A * 7/2008 ......... H01L 23/5283

OTHER PUBLICATIONS

Van Setten, Michiel J., et al. "Oxygen defect stability in amorphous, C-Axis aligned, and spinel IGZO." ACS Applied Electronic Materials 3.9 (2021): 4037-4046.

*Primary Examiner* — William B Partridge
*Assistant Examiner* — Felix B Andrews
(74) *Attorney, Agent, or Firm* — Harness, Dickey & Pierce, P.L.C.

(57) ABSTRACT

A semiconductor device includes: a substrate; a bit line above the substrate; a channel pattern on the bit line extending in a direction perpendicular to an upper surface of the bit line; a word line intersecting the bit line and spaced apart from the channel pattern; a gate insulating pattern between the channel pattern and the word line; an insulating pattern on the word line; and a landing pad connected to the channel pattern. The channel pattern includes first, second, and third channel patterns that are sequentially stacked, the first channel pattern is connected to the bit line, the second channel pattern is between the first channel pattern and the third channel pattern, the third channel pattern is connected to the landing pad, the first channel pattern and the third channel pattern include a crystalline oxide semiconductor material, and the second channel pattern includes an amorphous oxide semiconductor material.

20 Claims, 32 Drawing Sheets

(56)          References Cited

U.S. PATENT DOCUMENTS

2010/0289084 A1 * 11/2010 Yoon ................... H10B 63/845
                                                   257/368
2019/0378852 A1 * 12/2019 Baek .................. H01L 23/5226
2021/0343751 A1    11/2021 Yamazaki et al.
2022/0045219 A1     2/2022 Cho et al.
2022/0199836 A1     6/2022 Hwang et al.

* cited by examiner

TRC1

Gox_L

WL_L

120

CP3
CP2
CP1

CP

BL

110

SA

100

Z

Y ← ⊗ X

SEMICONDUCTOR DEVICE INCLUDING CHANNEL PATTERN AND METHOD FOR MANUFACTURING THE SAME

CROSS-REFERENCE TO RELATED APPLICATION

This application claims priority to and the benefit of Korean Patent Application No. 10-2023-0017328 filed in the Korean Intellectual Property Office on Feb. 9, 2023, the entire contents of which are incorporated herein by reference.

BACKGROUND

1. Field

The inventive concepts relate to semiconductor devices and methods for manufacturing (fabricating) the same.

2. Description of the Related Art

A degree of integration of a semiconductor memory device may be increased in order to meet excellent performance and low price demanded by a consumer. Since the degree of integration of the semiconductor memory device is an important factor in determining price of a product, an increased degree of integration is particularly desired.

Since a degree of integration of a two-dimensional or planar semiconductor memory device is mainly determined by an area occupied by a unit memory cell, the degree of integration is greatly influenced by a level of fine pattern formation technology. However, since ultra-expensive equipment may be required for miniaturization of a pattern, the degree of integration of the two-dimensional semiconductor memory device is increasing, but is still limited. Accordingly, the semiconductor memory device including a vertical channel transistor having a channel extending in a vertical direction has been proposed.

SUMMARY

Some example embodiments provide a semiconductor device having an improved electrical characteristics based on reducing contact resistance at an interface between a channel pattern and an electrode, and/or a method for manufacturing the semiconductor device.

A semiconductor device according to some example embodiments may include: a substrate; a bit line above the substrate; a channel pattern that is on the bit line and extends in a direction perpendicular to an upper surface of the bit line; a word line that intersects the bit line and is spaced apart from the channel pattern; a gate insulating pattern between the channel pattern and the word line; an insulating pattern on the word line; and a landing pad connected to the channel pattern. The channel pattern includes a first channel pattern, a second channel pattern, and a third channel pattern that are sequentially stacked, the first channel pattern is connected to the bit line, the second channel pattern is between the first channel pattern and the third channel pattern, the third channel pattern is connected to the landing pad, the first channel pattern and the third channel pattern include a crystalline oxide semiconductor material, and the second channel pattern includes an amorphous oxide semiconductor material.

A semiconductor device according to some example embodiments may include: a substrate; a bit line above the substrate; a first insulating pattern on the bit line; a channel pattern on an upper surface of the bit line and on a side surface of the first insulating pattern; a word line that crosses the bit line and is spaced apart from the channel pattern; a gate insulating pattern between the channel pattern and the word line; a second insulating pattern on the word line; and a landing pad connected to the channel pattern. The channel pattern includes a first channel pattern, second channel patterns, and a third channel pattern that are sequentially stacked, the first channel pattern is connected to the bit line, the second channel patterns are between the first channel pattern and the third channel pattern and the second channel patterns are separated from each other with the second insulating pattern interposed between the second channel patterns, the third channel pattern is connected to the landing pad, the first channel pattern and the third channel pattern include a crystalline oxide semiconductor material, and the second channel patterns include an amorphous oxide semiconductor material.

A method for manufacturing the semiconductor device according to some example embodiments may include: forming a bit line above a substrate; forming a channel pattern in which a first channel pattern, a second channel pattern, and a third channel pattern are sequentially stacked on the bit line; forming a gate insulating pattern on the channel pattern; forming a word line parallel to the channel pattern on the gate insulating pattern; and forming a landing pad connected to the channel pattern. The first channel pattern is connected to the bit line, the second channel pattern is between the first channel pattern and the third channel pattern, the third channel pattern is connected to the landing pad, the first channel pattern and the third channel pattern include a crystalline oxide semiconductor material, and the second channel pattern includes an amorphous oxide semiconductor material.

According to some example embodiments, an electrical characteristic of a semiconductor device may be improved based on reducing contact resistance of a channel pattern of the semiconductor device that contacts a bit line of the semiconductor device and a landing pad of the semiconductor device.

BRIEF DESCRIPTION OF THE DRAWINGS

FIG. 2 is a cross-sectional view taken along lines A-A' and B-B' of FIG. 1.

FIGS. 25, 26, 27, 28A, 28B, 29, 30, and 31 are cross-sectional views illustrating the method for manufacturing the semiconductor device according to some example embodiments.

DETAILED DESCRIPTION

Figure 1:
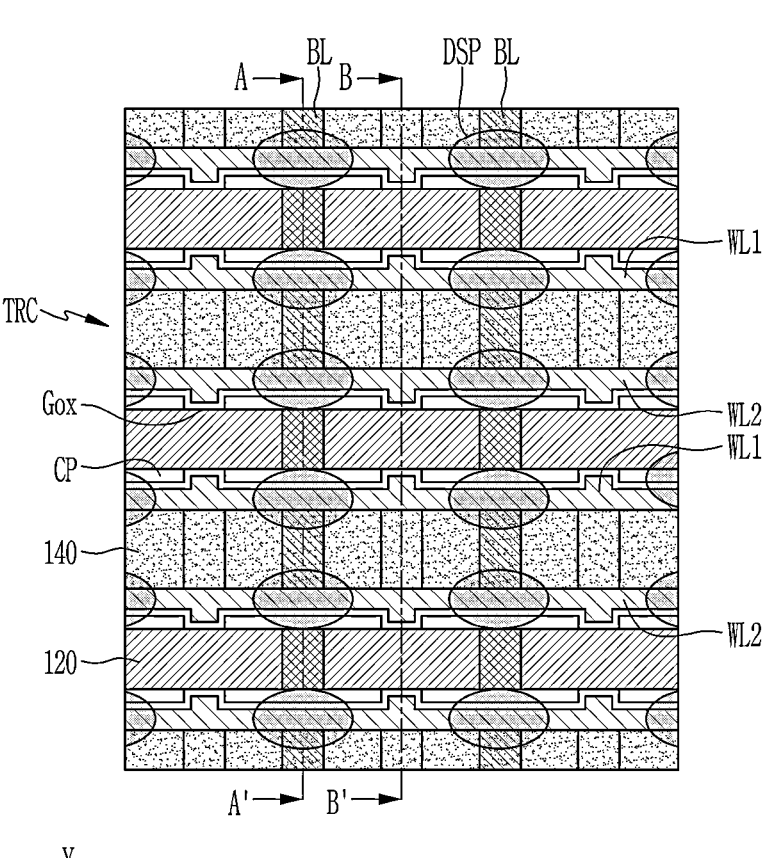
FIG. 1 is a layout diagram illustrating a semiconductor device according to some example embodiments.
Figure 1:
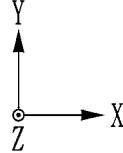

The inventive concepts will be described more fully hereinafter with reference to the accompanying drawings, in which some example embodiments of the inventive concepts are shown. As those skilled in the art would realize, the described example embodiments may be modified in various different ways, all without departing from the spirit or scope of the inventive concepts.

In order to clearly describe the inventive concepts, parts or portions that are irrelevant to the description are omitted, and identical or similar constituent elements throughout the specification are denoted by the same reference numerals.

Further, in the drawings, the size and thickness of each element are arbitrarily illustrated for ease of description, and the inventive concepts are not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area, or substrate is referred to as being "on" or "above" another element, it can be directly on the other element or intervening elements may also be. In contrast, when an element is referred to as being "directly on" another element, there are no intervening elements. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular", "substantially parallel", or "substantially coplanar" with regard to other elements and/or properties thereof will be understood to be "perpendicular", "parallel", or "coplanar", respectively, with regard to the other elements and/or properties thereof within manufacturing tolerances and/or material tolerances and/or have a deviation in magnitude and/or angle from "perpendicular", "parallel", or "coplanar", respectively, with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other. As described herein, the terms "contact" and "direct contact" may be used interchangeably.

FIG. 1 is a layout diagram illustrating a semiconductor device according to some example embodiments.

Figure 2:
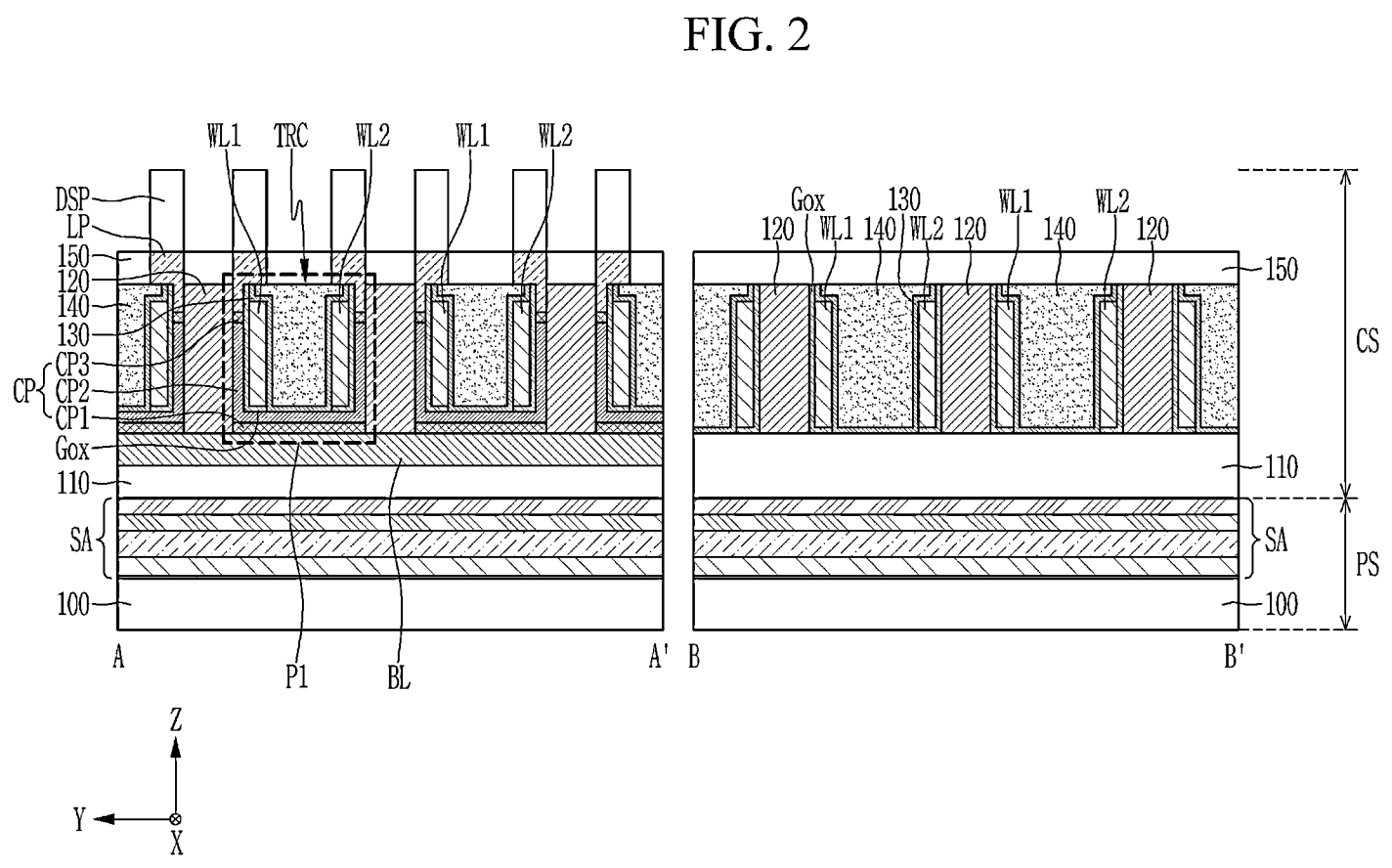
Figure 3:
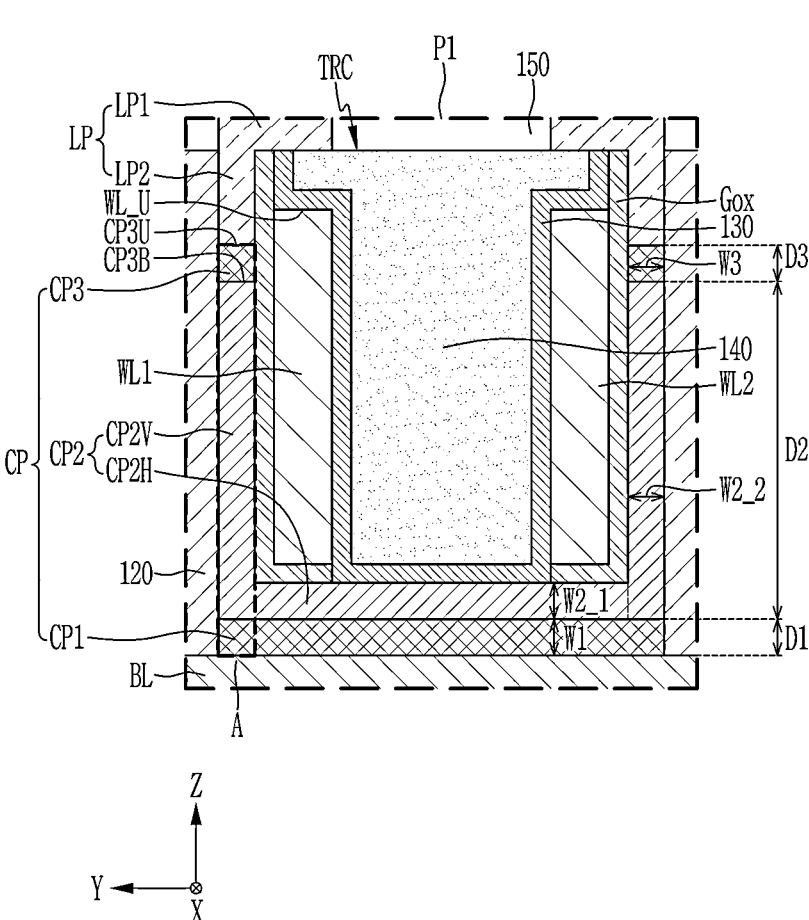
FIG. 3 is a partially enlarged view of P1 of FIG. 2.
Figure 4:
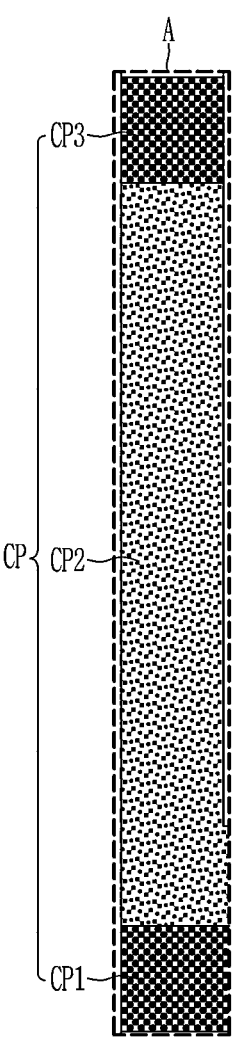
FIG. 4 is a partially enlarged view of a region A of FIG. 3.

FIG. 2 is a cross-sectional view taken along lines A-A' and B-B' of FIG. 1. FIG. 3 is a partially enlarged view of P1 of FIG. 2. FIG. 4 is a partially enlarged view of a region A of FIG. 3.

Referring to FIGS. 1 to 4, the semiconductor device according to some example embodiments may include a peripheral circuit structure PS and a cell array structure CS disposed on the peripheral circuit structure PS.

The peripheral circuit structure PS may include a substrate 100, and a core and peripheral circuits SA integrated on an upper surface of the substrate 100. The substrate 100 may have a structure in which a base substrate and an epitaxial layer are stacked, but the inventive concepts are not limited thereto. For example, in some example embodiments, the substrate 100 may be a silicon substrate, a gallium arsenide substrate, a silicon germanium substrate, or a semiconductor on insulator (SOI) substrate. Hereinafter, the substrate 100 will be described as being a silicon substrate.

The core and peripheral circuits SA may include NMOS and PMOS transistors integrated on the substrate 100. The core and peripheral circuits SA may be electrically connected to bit lines BL through peripheral circuit wires and peripheral circuit contact plugs. That is, sense amplifiers may be electrically connected to the bit lines BL, and each sense amplifier may amplify and output a difference in voltage level sensed by a pair of bit lines BL.

The cell array structure CS may include memory cells including a vertical channel transistor (VCT). The vertical channel transistor may refer to a structure in which a channel length extends in a direction perpendicular to the upper surface of the substrate 100.

In some example embodiments, the cell array structure CS may include a lower insulating layer 110, the bit line BL, a first insulating pattern 120, channel patterns CP, word lines WL1 and WL2, a gate insulating pattern Gox, a second insulating pattern 130, a third insulating pattern 140, landing pads LP, an interlayer insulating layer 150, and data storage patterns DSP.

The lower insulating layer 110 may cover the core and peripheral circuits SA, the peripheral circuit wires, and the peripheral circuit contact plugs above the substrate 100. The lower insulating layer 110 may include insulating films stacked in multiple layers. For example, the lower insulating layer 110 may include a silicon oxide film, a silicon nitride film, a silicon oxynitride film, and/or a low dielectric film.

The bit line BL may be disposed above the substrate 100. For example, the lower insulating layer 110 may be disposed above the substrate 100 and the bit line BL may be disposed on the lower insulating layer 110. The lower insulating layer 110 may be disposed to fill a space between the bit lines BL (e.g., between adjacent bit lines BL).

In some example embodiments, an upper surface of a portion of the lower insulating layer 110 disposed between the bit lines BL may be disposed at substantially the same level as that of an upper surface of the bit lines BL.

As described herein, a "level" of an element, surface, structure, or the like may be understood to refer to a distance of the element, surface, structure, or the like from a reference location (e.g., the substrate 100, an upper surface of the substrate 100, etc.) in a direction that is a vertical direction extending perpendicular to the substrate 100, an upper surface of the substrate 100, etc. Where elements, surfaces, structures or the like are described herein to be at a same "level," the elements, surfaces, structures or the like may be at a same distance from the reference location in the vertical direction (e.g., may be coplanar). Where a first element, surface, structure or the like is described herein to be higher or lower, or at a higher or lower "level" in relation to a second element, surface, structure or the like, the first element, surface, structure or the like may be further from or closer to, respectively, the reference location in the vertical direction in relation to the second element, surface, structure or the like.

The bit line BL may extend long in a second direction (a Y direction), for example the longitudinal axis of the bit line BL may extend in the second directions. Each of the plurality of bit lines BL may extend in the second direction (Y direction), and the plurality of bit lines BL may be spaced apart from each other in a first direction (a X direction) crossing (e.g., perpendicular to) the second direction (Y direction).

The bit line BL may include a doped polysilicon, a metal, a conductive metal nitride, a conductive metal silicide, a conductive metal oxide, or a combination thereof. For example, the bit line BL may include Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or a combination thereof, but the inventive concepts are not limited thereto. The bit line BL may include a single layer or multiple layers of the above material.

In some example embodiments, the bit line BL may include a two-dimensional semiconductor material, and for example, the two-dimensional semiconductor material may include a graphene, a carbon nanotube, or a combination thereof.

The first insulating pattern 120 may be disposed on the lower insulating layer 110. In some example embodiments, the first insulating pattern 120 may be disposed on an upper surface of the bit line BL. The first insulating pattern 120 may extend in the first direction (X direction) across the bit line BL, and first insulating patterns 120 may be spaced apart from each other in the second direction (Y direction).

The first insulating pattern 120 may form channel trenches TRC extending in the first direction (X direction) across the bit lines BL and spaced apart from each other in the second direction (Y direction).

For example, the first insulating pattern 120 may include at least one of a silicon oxide, a silicon oxynitride, a silicon nitride, or a low-k material (a low dielectric constant material) having a smaller dielectric constant than the silicon oxide, but the inventive concepts are not limited thereto.

For example, the low dielectric constant material may include at least one of a flowable oxide (FOX), torene silazene (TOSZ), undoped silicate glass (USG), borosilicate glass (BSG), phosphosilicate glass (PSG), borophosphosilicate glass (BPSG), plasma enhanced tetra ethyl ortho silicate (PETEOS), fluoride silicate glass (FSG), a carbon doped silicon oxide (CDO), xerogel, airgel, amorphous fluorinated carbon, organo silicate glass (OSG), parylene, bis-benzocyclobutenes (BCB), SiLK, a polyimide, a porous polymeric material, or a combination thereof, but the inventive concepts are not limited thereto.

The channel patterns CP may be disposed on the bit lines BL. The channel patterns CP may be spaced apart from each other in the second direction (Y direction) on each bit line BL. That is, the channel patterns CP may be spaced apart from each other along the first direction (X direction) and the second direction (Y direction) that cross each other to be disposed in a matrix form.

The channel pattern CP may include a first source/drain region and a second source/drain region. For example, a lower portion of the channel pattern CP may be connected to (e.g., in contact with) the bit line BL to function as the first source/drain region, an upper portion of the channel pattern CP may be connected to (e.g., in contact with) the landing pad LP to function as the second source/drain region, and a portion of the channel pattern CP between the first source/drain region and the second source/drain region may function as a channel region.

Specifically, the channel patterns CP may be spaced apart from each other in the second direction (Y direction) within each of the channel trenches TRC. In other words, the first insulating pattern 120 may be disposed between the channel patterns CP adjacent in the second direction (Y direction). The channel patterns CP may be disposed within the first insulating patterns 120 that are spaced apart from each other in the second direction (Y direction). That is, the channel patterns CP may extend along a profile of the channel trench TRC. Accordingly, in a cross-section, the channel patterns CP may have an approximate "U" shape (e.g., may each have an approximate "U" shape).

In some example embodiments, each of the channel patterns CP may include a first channel pattern CP1, a second channel pattern CP2, and a third channel pattern CP3. That is, the first channel pattern CP1, the second channel pattern CP2, and the third channel pattern CP3 may be sequentially stacked from the upper surface of the bit line BL.

The first channel pattern CP1 may contact (e.g., contact) the bit line BL. That is, as shown in at least FIG. 3, the first channel pattern CP1 may contact (e.g., contact) the upper surface of the bit line BL.

The second channel pattern CP2 may be disposed between the first channel pattern CP1 and the third channel pattern CP3 (e.g., between the first channel pattern CP1 and the third channel pattern CP3 in a vertical direction extending perpendicular to an upper surface of the substrate 100, such as the Z direction), and may extend from the upper surface of the bit line BL in a vertical direction.

In a cross-section, and as shown in at least FIG. 3, the second channel pattern CP2 may include a second channel pattern horizontal portion CP2H extending in the second direction (Y direction) and disposed on an upper surface of the first channel pattern CP1 and second channel pattern vertical portions CP2V extending from the upper surface of the first channel pattern CP1 in a third direction (a Z direction) and facing each other in the second direction (Y direction). That is, an end portion of the second channel pattern horizontal portion CP2H may be connected to a side surface of the second channel pattern vertical portion CP2V such that at least two separate second channel pattern vertical portions CP2V may extend in the third direction (e.g., in parallel) from opposite ends, in the second direction, of the second channel pattern horizontal portion CP2H, and the second channel pattern horizontal portion CP2H and the second channel pattern vertical portion CP2V may be integrally formed, such that the second channel pattern horizontal and vertical portions CP2H and CP2V may be separate portions of a single, unitary piece of material.

The third channel pattern CP3 may be disposed at an end portion of the second channel pattern CP2. That is, as shown in at least FIG. 3, an upper surface CP3U of the third channel pattern CP3 may contact (e.g., contact) the landing pad LP that will be described later, and a lower surface CP3B may contact the upper surface of the second channel pattern CP2.

In some example embodiments, the upper surface CP3U of the third channel pattern CP3 may be disposed at a lower level (e.g., in relation to a reference structure such as the substrate 100 or an upper surface of the substrate 100 in the Z direction) than an upper surface of the gate insulating pattern Gox, an upper surface of the second insulating pattern 130, and an upper surface WL_U of the word lines WL1 and WL2.

The first channel pattern CP1 may have a first thickness W1, the second channel pattern horizontal portion CP2H may have a second thickness W2_1 (e.g., in the third direction), the second channel pattern vertical portion CP2V may have a third thickness W2_2, and the third channel pattern CP3 may have a fourth thickness W3. In this case, the first thickness W1 and the second thickness W2_1 mean a thickness along the third direction (Z direction), and the third thickness W2_2 and the fourth thickness W3 mean a thickness along the second direction (Y direction).

In some example embodiments, the first thickness W1 to the fourth thickness W3 may be substantially the same. However, the inventive concepts are not limited thereto, and in some example embodiments, at least one of the first thickness W1 to the fourth thickness W3 may be different from at least one other thickness of the first thickness W1 to the fourth thickness W3. For example, at least one pattern of the first channel pattern CP1, the second channel pattern CP2, or the third channel pattern CP3 may have a different thickness than at least one other pattern of the first channel pattern CP1, the second channel pattern CP2, or the third channel pattern CP3. For example, the first thickness W1 and the fourth thickness W3 may be substantially equal to each other, and the first thickness W1 and the fourth thickness W3 may differ from the second thickness W2_1 and the third thickness W2_2, respectively. As another example, the first thickness W1 and the fourth thickness W3 may be different, and the second thickness W2_1 and the third thickness W2_2 may be substantially the same. As another example, the first thickness W1 to the fourth thickness W3 may be different.

The first channel pattern CP1 may have a first length D1 in the third direction (Z direction), the second channel pattern vertical portion CP2V may have a second length D2 in the third direction (Z direction), and the third channel pattern CP3 may have a third length D3 in the third direction (Z direction). The first length D1 may be substantially equal to the first thickness W1, and the third length D3 may be substantially equal to the fourth thickness W3.

In some example embodiments, the second length D2 may be greater than the first length D1 and the third length D3, and the first length D1 and the third length D3 may be substantially equal to each other. However, the inventive concepts are not limited thereto, and the first length D1 to the third length D3 may be variously changed.

The first channel pattern CP1, the second channel pattern CP2, and the third channel pattern CP3 may include an oxide semiconductor material including at least two of In, Ga, Zn, Al, Sn, Hf, and the like. That is, the first channel pattern CP1, the second channel pattern CP2, and the third channel pattern CP3 may include the oxide semiconductor material in which the at least two of In, Ga, Zn, Al, Sn, Hf, and the like are combined. In addition, a material such as Si, Mg, Ta, La, Nd, Ce, Sc, Cr, Co, Nb, Mo, Ba, Gd, Ti, W, Pd, Ru, Ni, Mn, or the like may be further included in the composition.

For example, the first channel pattern CP1, the second channel pattern CP2, and the third channel pattern CP3 may include an indium gallium zinc oxide (IGZO), an indium gallium silicon oxide (IGSO), an indium tin zinc oxide (ITZO), an indium zinc oxide (IZO), a zinc oxide (ZnO), a zinc tin oxide (ZTO), a zinc oxynitride (ZnON), a zirconium zinc tin oxide (ZZTO), a tin oxide (SnO), a hafnium indium zinc oxide (HIZO), a gallium zinc tin oxide (GZTO), an aluminum zinc tin oxide (AZTO), a ytterbium gallium zinc oxide (YGZO), an indium gallium oxide (IGO), or a combination thereof. However, the inventive concepts are not limited thereto, and the oxide semiconductor material included in the first channel pattern CP1, the second channel pattern CP2, and the third channel pattern CP3 may be variously changed.

In some example embodiments, the first channel pattern CP1, the second channel pattern CP2, and the third channel pattern CP3 may include the same oxide semiconductor material. In this case, the first channel pattern CP1 and the third channel pattern CP3 may include a crystalline oxide semiconductor material, and the second channel pattern CP2 may include an amorphous oxide semiconductor material.

For example, the first channel pattern CP1, the second channel pattern CP2, and the third channel pattern CP3 may include an IGZO. In this case, a composition ratio of In, Ga, Zn, O, H, and the like included in each of the first channel pattern CP1, the second channel pattern CP2, and the third channel pattern CP3 may be different.

In this case, composition ratios of materials included in the first channel pattern CP1 and the third channel pattern CP3 may be different from a composition ratio of a material included in the second channel pattern CP2.

That is, a ratio of In, Ga, and the like included in the first channel pattern CP1 and a ratio of In, Ga, and the like included in the third channel pattern CP3 may be greater than a ratio of In, Ga, and the like included in the second channel pattern CP2.

In some example embodiments, when the first channel pattern CP1 and the third channel pattern CP3 are additionally doped with hydrogen (H) to improve crystallinity of the oxide semiconductor, a ratio of hydrogen (H) included in each of the first channel pattern CP1 and the third channel pattern CP3 may be greater than a ratio of hydrogen (H) included in the second channel pattern CP2. That is, a composition ratio of hydrogen (H) included in the oxide semiconductor of the first channel pattern CP1 and a composition ratio of hydrogen (H) included in the oxide semiconductor of the third channel pattern CP3 may be greater than a composition ratio of hydrogen (H) included in a metal oxide layer of the second channel pattern CP2.

Although the above description has been made using the IGZO as an example, the inventive concepts are not limited thereto, and when each of the first channel pattern CP1, the second channel pattern CP2, and the third channel pattern CP3 includes an oxide semiconductor, the above description may be applied.

In some example embodiments, at least one of the first channel pattern CP1, the second channel pattern CP2, or the third channel pattern CP3 may include different materials. For example, at least one of the first channel pattern CP1, the second channel pattern CP2, or the third channel pattern CP3 may include a different material than at least one other pattern of the first channel pattern CP1, the second channel pattern CP2, or the third channel pattern CP3. For example, at least one at least one of the first channel pattern CP1, the second channel pattern CP2, or the third channel pattern CP3 may include a material that is absent from at least one other pattern of the first channel pattern CP1, the second channel pattern CP2, or the third channel pattern CP3.

For example, the first channel pattern CP1 and the third channel pattern CP3 may include the same crystalline oxide semiconductor, and the second channel pattern CP2 may include an amorphous oxide semiconductor different from the crystalline oxide semiconductor of each of the first and third channel patterns CP1 and CP3. In some example embodiments, the first channel pattern CP1 and the third channel pattern CP3 may not include the amorphous oxide semiconductor that is included in the second channel pattern CP2, and the second channel pattern CP2 may not include the crystalline oxide semiconductor that is included in the first channel pattern CP1 and the third channel pattern CP3.

Specifically, the first channel pattern CP1 and the third channel pattern CP3 including the crystalline oxide semiconductor may include any one of a c-axis aligned crystalline (CAAC) IGZO, a spinel IGZO, an indium tin oxide (ITO), or In$_2$O$_3$:H, and the second channel pattern CP2 including the amorphous oxide semiconductor may include any one of a GSO, an ITZO, an IZO, a ZnO, a ZTO, a ZnON, a ZZTO, an SnO, a HIZO, a GZTO, an AZTO, a YGZO, or a combination thereof.

As another example, the first channel pattern CP1, the second channel pattern CP2, and the third channel pattern CP3 may include different materials (e.g., different material compositions). That is, the first channel pattern CP1 may include a crystalline oxide semiconductor different from that of the third channel pattern CP3, and the second channel pattern CP2 may include an amorphous oxide semiconductor different from the crystalline oxide semiconductor of each of the first and third channel patterns CP1 and CP3.

Specifically, the first channel pattern CP1 may include a CAAC IGZO as the crystalline oxide semiconductor, the second channel pattern CP2 may include an ITZO as the amorphous oxide semiconductor, and the third channel pattern CP3 may include an ITO as the crystalline oxide semiconductor.

Since the first channel pattern CP1 and the third channel pattern CP3 include the crystalline oxide semiconductor and the second channel pattern CP2 includes the amorphous oxide semiconductor, the first and third channel patterns CP1 and CP3 and the second channel pattern CP2 may have different physical properties. For example, the first channel pattern CP1 and the third channel pattern CP3 may have different densities, different interface characteristics, or the like from those of the second channel pattern CP2.

As shown in FIG. 4, when the first channel pattern CP1 and the third channel pattern CP3 are compared with the second channel pattern CP2, a gap between atoms included in the oxide semiconductor may become close as crystallinity of the atoms increases, and thus, a density of the first channel pattern CP1 and a density of the third channel pattern CP3 may be greater than that of the second channel pattern CP2 (e.g., greater than the density of the second channel pattern CP2).

In addition, when the first channel pattern CP1 and the third channel pattern CP3 contact (e.g., contact) a metal layer, the first channel pattern CP1 and the third channel pattern CP3 may have lower contact resistance than the second channel pattern CP2.

That is, since the first channel pattern CP1 and the third channel pattern CP3 include the crystalline oxide semiconductor, energy for forming an oxide film at a contact interface when the first channel pattern CP1 and the third channel pattern CP3 contact the metal layer may be relatively high compared with the second channel pattern CP2 including the amorphous oxide semiconductor. In other words, since it is difficult for the oxide film to be formed at the contact interface between the first channel pattern CP1 and the third channel pattern CP3 and the metal layer compared with the second channel pattern CP2, the first channel pattern CP1 and the third channel pattern CP3 may have a larger contact area when the first channel pattern CP1 and the third channel pattern CP3 contact the metal layer compared with the second channel pattern CP2.

Accordingly, when the first channel pattern CP1 and the third channel pattern CP3 contact the metal layer, the first channel pattern CP1 and the third channel pattern CP3 may have lower contact resistance than the second channel pattern CP2.

The word lines WL1 and WL2 may extend in the first direction (X direction) across the bit lines BL, and may be disposed to be spaced apart from each other along the second direction (Y direction). The word lines WL1 and WL2 may be spaced apart from the bit line BL in the third direction (Z direction), and may cross (or intersect) the bit line BL. A pair of the word lines WL1 and WL2 may be disposed between the channel patterns CP within the channel trench TRC.

Specifically, each of the word lines WL1 and WL2 may include one surface and another surface opposite to the first surface, and one surfaces of the word lines WL1 and WL2 may be disposed to face each other between the channel patterns CP.

The one surfaces of the word lines WL1 and WL2 may be in contact with the second insulating pattern 130 to be described later, and other surfaces of the word lines WL1 and WL2 may be adjacent to the second channel pattern vertical portion CP2V and the third channel pattern CP3 to contact the gate insulating pattern Gox to be described later.

The word lines WL1 and WL2 may include the upper surface WL_U and a lower surface facing each other in the third direction (Z direction). Upper surfaces WL_U of the word lines WL1 and WL2 may contact the second insulating pattern 130 to be described later, and may face the landing pad LP with the second insulating pattern 130 interposed between the upper surfaces WL_U and the landing pad LP.

Lower surfaces of the word lines WL1 and WL2 may contact the gate insulating pattern Gox to be described later, and may face the bit line BL with the gate insulating pattern Gox and the channel pattern CP interposed between the lower surfaces and the bit line BL.

In some example embodiments, the upper surfaces WL_U of the word lines WL1 and WL2 are shown to be disposed at a higher level than upper surfaces CP3U of the channel patterns CP, but in some example embodiments, the upper surfaces WL_U of the word lines WL1 and WL2 may be disposed at substantially the same level as or a lower level than upper surfaces of the channel patterns CP. In some example embodiments, the upper surfaces WL_U of the word lines WL1 and WL2 are at a different level than upper surfaces CP3U of the third channel pattern CP3 (e.g., a different level in the Z direction in relation to the substrate 100). A detailed description of the levels of the upper surfaces WL_U of the word lines WL1 and WL2 will be described later with reference to FIG. 5.

For example, the word lines WL1 and WL2 may include a doped polysilicon, a metal, a conductive metal nitride, a conductive metal silicide, a conductive metal oxide, or a combination thereof. For example, the word lines WL1 and WL2 may include Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, $RuO_x$, or a combination thereof, but the inventive concepts are not limited thereto.

The word lines WL1 and WL2 may include a single layer or multiple layers of the above material. In some example embodiments, the word lines WL1 and WL2 may include a two-dimensional semiconductor material, and for example, the two-dimensional semiconductor material may include graphene, carbon nanotubes, or a combination thereof.

The gate insulating pattern Gox may extend in the third direction (Z direction) along the word lines WL1 and WL2. The gate insulating pattern Gox may not be disposed on the second channel pattern horizontal portion CP2H that does not overlap the word lines WL1 and WL2 in the third direction (Z direction).

That is, in a cross-section, the gate insulating pattern Gox between the first word line WL1 and the second channel pattern horizontal portion CP2H may be separated from (e.g., spaced apart from) the gate insulating pattern Gox between the second word line WL2 and the second channel pattern horizontal portion CP2H. In other words, in a cross-section, the gate insulating pattern Gox may extend along side surfaces and lower surfaces of the word lines WL1 and WL2 adjacent to the channel pattern CP.

In addition, a portion of the gate insulating pattern Gox may protrude in the third direction (Z direction) from the upper surfaces WL_U of the word lines WL1 and WL2. A portion of the gate insulating pattern Gox may protrude in the third direction (Z direction) from the upper surface CP3U of the third channel pattern CP3, and may contact the landing pad LP.

The gate insulating pattern Gox may be formed of a silicon oxide film, a silicon oxynitride film, a high dielectric film having a higher dielectric constant than the silicon oxide film, or a combination thereof. The high dielectric film may include a metal oxide or a metal oxynitride. For example, the high dielectric film usable as the gate insulating pattern Gox may be made of $HfO_2$, HfSiO, HfSiON, HfTaO, HfTiO, HfZrO, $ZrO_2$, $Al_2O_3$, or a combination thereof, but the inventive concepts are not limited thereto, and a material included in the gate insulating pattern Gox may be variously changed.

The second insulating pattern 130 may be disposed above the channel pattern CP and the lower insulating layer 110, and the second insulating pattern 130 may be disposed within the channel trench TRC. The second insulating pattern 130 may be disposed on the channel pattern CP and the word lines WL1 and WL2.

The second insulating pattern 130 may contact an upper surface of the second channel pattern horizontal portion CP2H. The second insulating pattern 130 may extend along side surfaces of the word lines WL1 and WL2 and the upper surfaces WL_U of the word lines WL1 and WL2, and may contact the side surfaces and the upper surfaces WL_U of the word lines WL1 and WL2.

In addition, like the gate insulating pattern Gox, a portion of the second insulating pattern 130 may protrude in the third direction (Z direction) from the upper surfaces WL_U of the word lines WL1 and WL2, and may contact a portion of the gate insulating pattern Gox protruding in the third direction (Z direction) from the upper surface CP3U of the third channel pattern CP3.

In some example embodiments, the second insulating pattern 130 may include the same material as the gate insulating pattern Gox described above. However, the inventive concepts are not limited thereto, and in some example embodiments, the second insulating pattern 130 may include an insulating material different from that of the gate insulating pattern Gox.

The third insulating pattern 140 may be disposed within the channel trench TRC. The third insulating pattern 140 may fill the channel trench TRC remaining after the channel pattern CP, the gate insulating pattern Gox, the word lines WL1 and WL2, and the second insulating pattern 130 are formed.

That is, the third insulating pattern 140 may include a horizontal portion and a vertical portion. The vertical portion of the third insulating pattern 140 may extend in the third direction (Z direction) from the horizontal portion of the third insulating pattern 140 toward the bit line BL. The vertical portion of the third insulating pattern 140 may be closer to the bit line BL than the horizontal portion of the third insulating pattern 140.

The horizontal portion of the third insulating pattern 140 may be disposed above the upper surfaces WL_U of the word lines WL1 and WL2, and the vertical portion of the third insulating pattern 140 may be disposed above the bit line BL. Accordingly, in a cross-section, the third insulating pattern 140 may have an approximately "T" shape. However, a cross-sectional shape of the third insulating pattern 140 is not limited thereto, and may be variously modified.

For example, the third insulating pattern 140 may include at least one of a silicon oxide, a silicon oxynitride, a silicon nitride, or a low-k material (a low dielectric constant material) having a smaller dielectric constant than the silicon oxide, but the inventive concepts are not limited thereto.

Each of the landing pads LP may be disposed to overlap at least a portion of the channel pattern CP in the third direction (Z direction) that is a vertical direction. The landing pads LP may be spaced apart from each other in the first direction (X direction) and the second direction (Y direction) to be disposed in a matrix form. However, this is just an example, and as long as the landing pads LP are connected to the channel pattern CP, the plurality of landing pads LP may be disposed in various other shapes such as a honeycomb shape and the like.

In addition, the landing pads LP may have various shapes such as a circular shape, an elliptical shape, a rectangular shape, a square shape, a rhombus shape, a hexagon shape, and the like on a plane. However, a planar shape of the landing pad LP is not limited thereto.

The landing pads LP may be disposed on the first insulating pattern 120 and the third insulating pattern 140. The landing pads LP may be connected to the channel pattern CP. The landing pads LP may pass through the interlayer insulating layer 150 to contact an upper portion of the channel pattern CP.

Specifically, the landing pads LP may include a first portion LP1 extending in the second direction (Y direction) and a second portion LP2 extending in the third direction (Z direction) from the first portion LP1.

The first portion LP1 of the landing pad LP may be disposed on an upper surface of the gate insulating pattern Gox, an upper surface of the second insulating pattern 130, and an upper surface of the third insulating pattern 140. In FIG. 3, a lower surface of the first portion LP1 of the landing pad LP is shown to be disposed at substantially the same level as an upper surface of the first insulating pattern 120 and the upper surface of the third insulating pattern 140, but the inventive concepts are not limited thereto. In some example embodiments, the lower surface of the first portion LP1 of the landing pad LP may be disposed at a level lower than the upper surface of the first insulating pattern 120 and the upper surface of the third insulating pattern 140.

The second portion LP2 of the landing pad LP may extend from the first portion LP1 in the third direction (Z direction), and may contact the upper surface CP3U of the third channel pattern CP3.

In addition, one side of the second portion LP2 of the landing pad LP may be in contact with the first insulating pattern 120, and the other side of the second portion LP2 of the landing pad LP may be in contact with the gate insulating pattern Gox. A lower surface of the second portion LP2 of the landing pad LP may be disposed at a lower level than the upper surfaces WL_U of the word lines WL1 and WL2. However, the inventive concepts are not limited thereto. For example, the lower surface of the second portion LP2 of the landing pad LP may be disposed at substantially the same level as the upper surfaces WL_U of the word lines WL1 and WL2.

Accordingly, the landing pad LP may be electrically connected to the first channel pattern CP1 and the second channel pattern CP2 through the third channel pattern CP3. However, since this is only an example, a disposition of the landing pads LP may be varied as long as the landing pads LP are connected to the channel pattern CP.

The landing pads LP may include a doped polysilicon, a metal, a conductive metal nitride, a conductive metal silicide, a conductive metal oxide, or a combination thereof. For example, the landing pads LP may include Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but the inventive concepts are not limited thereto.

The interlayer insulating layer 150 may fill a space between the landing pads LP spaced apart from each other in the second direction (Y direction) on the first insulating pattern 120 and the third insulating pattern 140. For example, a lower surface of the interlayer insulating layer 150 may be disposed at substantially the same level as a lower surface of the first portion LP1 of the landing pads LP. However, the inventive concepts are not limited thereto, and in some example embodiments, the lower surface of the interlayer insulating layer 150 may be disposed at a different level from the lower surface of the first portion LP1 of the landing pads LP.

The data storage patterns DSP may be respectively disposed on the landing pads LP. The data storage patterns DSP may be electrically connected to the channel pattern CP through the landing pads LP, respectively. As shown in FIG. 1, the data storage patterns DSP may be disposed in a matrix form along the first direction (X direction) and the second direction (Y direction).

In some example embodiments, the data storage patterns DSP may be a capacitor, and may include a capacitor dielectric film interposed between lower and upper electrodes. When the data storage patterns DSP have the above structure, the lower electrode may contact the landing pad LP, and the lower electrode may have various shapes such as a circular shape, an elliptical shape, a rectangular shape, a square shape, a rhombus shape, a hexagon shape, and the like on a plane.

Alternatively, the data storage patterns DSP may be a variable resistance pattern that may be switched into two resistance states by an electrical pulse applied to a memory element. For example, the data storage patterns DSP may include a phase-change material in which a crystalline state changes depending on an amount of electric current, a perovskite compound, a transition metal oxide, a magnetic material, a ferromagnetic material, or an antiferromagnetic material.

According to the semiconductor device according to some example embodiments, since the first channel pattern CP1 and the third channel pattern CP3 include the crystalline oxide semiconductor and the second channel pattern CP2 includes the amorphous oxide semiconductor, the semiconductor device with an improved electrical characteristic may be provided. Accordingly, electrical characteristics of a semiconductor device including the channel pattern that includes the first to third channel patterns CP1 to CP3, and any electronic device including same, may be improved.

That is, since the first channel pattern CP1 contacting the bit line BL and the third channel pattern CP3 contacting the landing pad LP include the crystalline oxide semiconductor, formation of an oxide film may be suppressed at an interface between the first channel pattern CP1 and the bit line BL and an interface between the third channel pattern CP3 and the landing pad LP.

Therefore, since contact resistance decreases at the interface between the first channel pattern CP1 and the bit line BL and at the interface between the third channel pattern CP3 and the landing pad LP, a leakage current may be reduced, and at the same time, an interface characteristic of the channel pattern CP in contact with the bit line BL and the landing pad LP may be improved so that the semiconductor device having excellent performance and operating characteristic is provided.

Hereinafter, some example embodiments of the semiconductor device will be described with reference to FIGS. 5 to 8. In the following example embodiments, the same reference numeral refers to a component identical to that of the previously described example embodiments, and redundant description will be omitted or simplified, and a difference between the following example embodiments and the previously described example embodiments will be mainly described.

FIGS. 5 to 8 are partially enlarged views of P1 of FIG. 2 according to some example embodiments.

Figure 5:
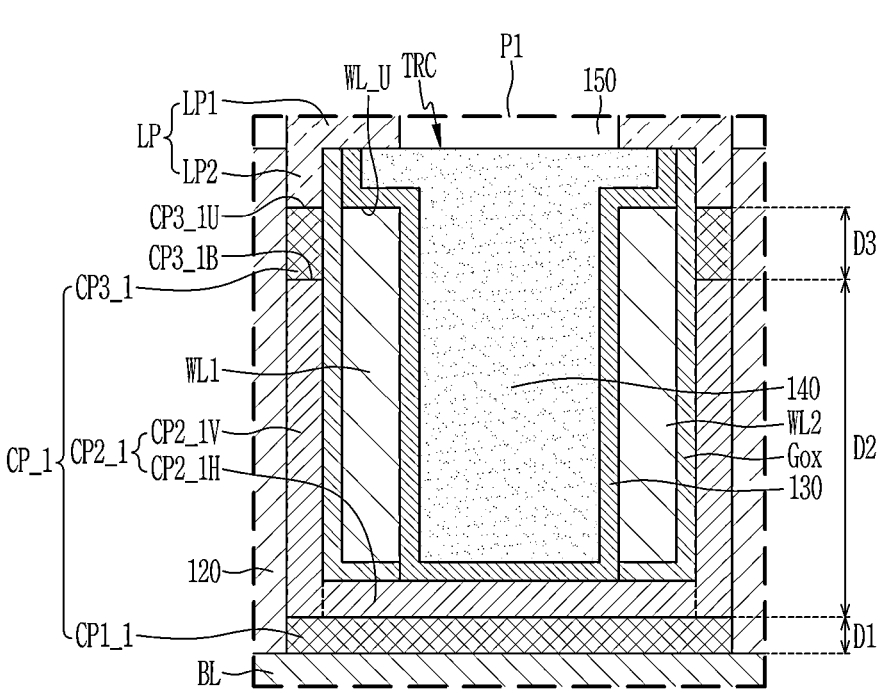
FIGS. 5, 6, 7, and 8 are partially enlarged views of P1 of FIG. 2 according to some example embodiments.
Figure 5:
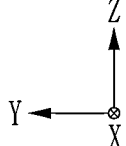

Referring to FIG. 5, like some example embodiments, including the example embodiments shown in FIG. 3, a channel pattern CP_1 may include a first channel pattern CP1_1 that may have a first length D1 in the third direction (Z direction), a second channel pattern CP2_1 that may include a second channel pattern horizontal portion CP2_1H and a second channel pattern vertical portion CP2_1V that may have a second length D2 in the third direction (Z direction), and a third channel pattern CP3_1 may have an upper surface CP3_1U and a lower surface CP3_1B and may have a third length D3 in the third direction (Z direction).

However, according to some example embodiments shown in FIG. 5, unlike some example embodiments, including the example embodiments shown in FIG. 3, the first length D1, the second length D2, and the third length D3 may be different (e.g., different from each other). For example, the second length D2 may be longer than the first length D1 and the third length D3, and the third length D3 may be longer than the first length D1. However, the inventive concepts are not limited thereto, and in some example embodiments, the first length D1 may be longer than the third length D3.

In addition, an upper surface CP3_1U of the third channel pattern CP3_1 may be disposed at substantially the same level (e.g., in relation to the substrate 100 in the Z direction) as the upper surfaces WL_U of the word lines WL1 and WL2. That is, as shown in FIG. 5, since the third length D3 is longer than the first length D1, the third channel pattern CP3_1 according to some example embodiments shown in FIG. 5 may be disposed to further extend in the third direction (Z direction) toward the landing pad LP when the third channel pattern CP3_1 according to some example embodiments shown in FIG. 5 is compared with the third channel pattern CP3 according to some example embodiments shown in FIG. 3.

Accordingly, the upper surface CP3_1U of the third channel pattern CP3_1 may be disposed at substantially the same level as the upper surfaces WL_U of the word lines WL1 and WL2.

In some example embodiments, since the third channel pattern CP3_1 further extends in the third direction (Z direction) than the upper surfaces WL_U of the word lines WL1 and WL2, the upper surface CP3_1U of the third channel pattern CP3_1 may be disposed at a higher level than the upper surfaces WL_U of the word lines WL1 and WL2.

In addition, in some example embodiments, since the first length D1 is longer than the third length D3, the first channel pattern CP1_1 according to some example embodiments shown in FIG. 5 may be disposed to further extend in the third direction (Z direction) when the first channel pattern CP1_1 according to some example embodiments, including the example embodiments shown in FIG. 5 is compared with the first channel pattern CP1 according to some example embodiments, including the example embodiments shown in FIG. 3. Thus, the upper surface CP3_1U of the third channel pattern CP3_1 may be disposed at substantially the same level as the upper surfaces WL_U of the word lines WL1 and WL2. However, the inventive concepts are not limited thereto, and a position of the upper surface CP3_1U of the third channel pattern CP3_1 may vary according to changes in the first length D1, the second length D2, and the third length D3.

Figure 6:
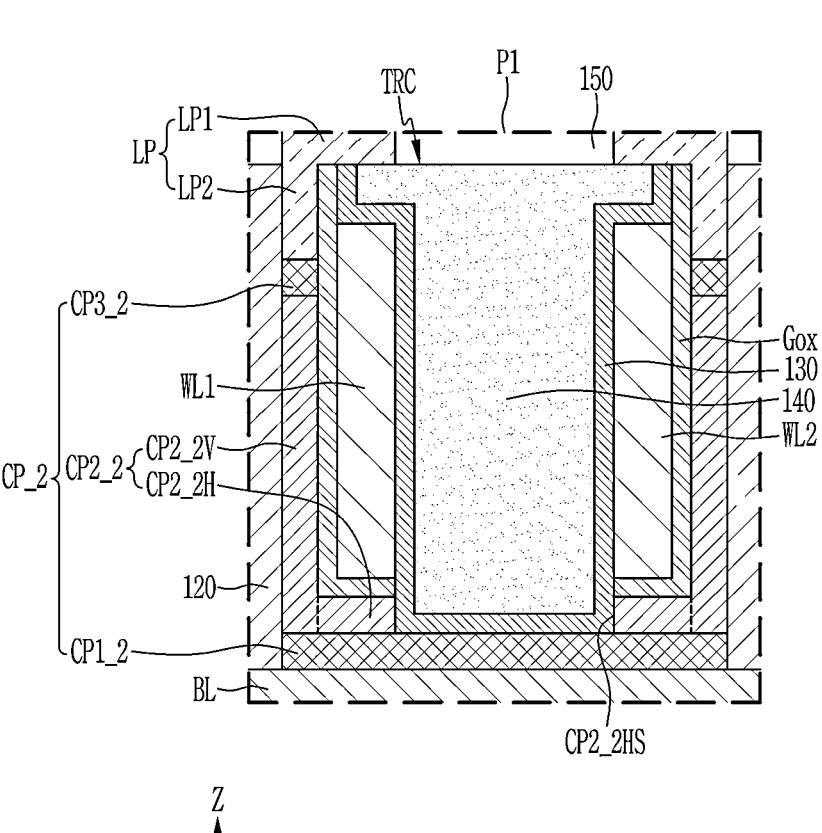
Figure 6:
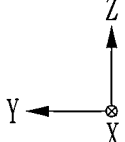

Referring to FIG. 6, unlike some example embodiments, including the example embodiments shown in FIG. 3, a channel pattern CP_2 may include a first channel pattern CP1_2, second channel patterns CP2_2 that may be disposed to be spaced apart from each other in the second direction (Y direction) with the third insulating pattern 140 interposed between the second channel patterns CP2_2, and a third channel pattern CP3_2.

Specifically, the second channel pattern CP2_2 may not be disposed on a first channel pattern CP1_2 that does not overlap the gate insulating pattern Gox in the third direction (Z direction).

Specifically, in a cross-section, a second channel pattern horizontal portion CP2_2H between the first channel pattern CP1_2 and the gate insulating pattern Gox adjacent to the first word line WL1 may be separated from the second channel pattern horizontal portion CP2_2H between the first channel pattern CP1_2 and the gate insulating pattern Gox adjacent to the second word line WL2. That is, second channel pattern horizontal portions CP2_2H disposed on the first channel pattern CP1_2 may be disposed to be spaced apart from each other in the second direction (Y direction) with the third insulating pattern 140 interposed between the second channel pattern horizontal portions CP2_2H.

An end portion CP2_2HS of the second channel pattern horizontal portion CP2_2H may be disposed on the first channel pattern CP1_2.

Accordingly, the second channel pattern horizontal portion CP2_2H may extend along the lower surfaces of the word lines WL1 and WL2, and a second channel pattern vertical portion CP2_2V may extend along side surfaces of the word lines WL1 and WL2 close to the gate insulating pattern Gox.

According to some example embodiments, including the example embodiments shown in FIG. 6, the second insulating pattern 130 and the third insulating pattern 140 may be disposed to further extend in the third direction (Z direction) toward the bit line BL compared with some example embodiments, including the example embodiments shown in FIG. 3. Accordingly, the second insulating pattern 130 may contact an upper surface of the first channel pattern CP1_2 and the end portion CP2_2HS of the second channel pattern horizontal portion CP2_2H close to the third insulating pattern 140 (e.g., the respective end portions CP2_2HS of second channel patterns CP2_2 on the first channel pattern CP1_2 and spaced apart from each other in the second direction (e.g., Y direction).

In FIG. 6, the lower surface of the second insulating pattern 130 and a lower surface of the third insulating pattern 140 are shown to be disposed at a lower level than an upper surface of the second channel pattern horizontal portion CP2_2H, but the inventive concepts are not limited thereto. For example, the lower surface of the second insulating pattern 130 and the lower surface of the third insulating pattern 140 may be disposed at substantially the same level as or a higher level than the upper surface of the second channel pattern horizontal portion CP2_2H.

In addition, the end portion CP2_2HS of the second channel pattern horizontal portion CP2_2H close to the third insulating pattern 140 may be aligned on substantially the same boundary as (e.g., coplanar or substantially coplanar with) the side surfaces of the word lines WL1 and WL2 close to the third insulating pattern 140 and an end portion of the gate insulating pattern Gox. However, the inventive concepts are not limited thereto.

In some example embodiments, the end portion CP2_2HS of the second channel pattern horizontal portion CP2_2H close to the third insulating pattern 140 may not be disposed at the same boundary as the side surfaces of the word lines WL1 and WL2 and the end portion of the gate insulating pattern Gox. For example, the end portion CP2_2HS of the second channel pattern horizontal portion CP2_2H close to the third insulating pattern 140 may be disposed to protrude more in the second direction (Y direction) than the side surfaces of the word lines WL1 and WL2 and the end portion of the gate insulating pattern Gox.

Figure 7:
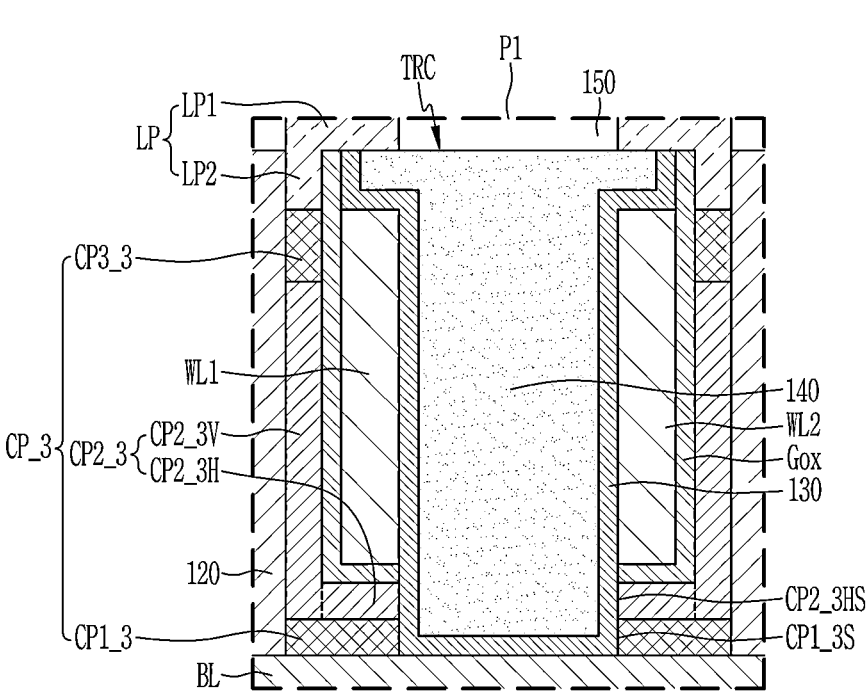
Figure 7:
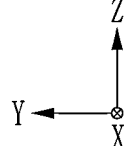

According to some example embodiments shown in FIG. 7, unlike some example embodiments, including the example embodiments shown in FIG. 6, a channel pattern CP_3 may include first channel patterns CP1_3 that may be disposed to be spaced apart from each other in the second direction (Y direction) with the third insulating pattern 140 interposed between the first channel patterns CP1_3. The channel pattern CP_3 may further include second channel patterns CP2_3 including vertical and horizontal portions CP2_3V and CP2_3H and a third channel pattern CP3_3.

Specifically, the first channel pattern CP1_3 may not be disposed on a bit line BL that does not overlap a second channel pattern CP2_3 in the third direction (Z direction).

Specifically, in a cross-section, the first channel pattern CP1_3 disposed between the second channel pattern CP2_3 adjacent to the first word line WL1 and the bit line BL may be separated from the first channel pattern CP1_3 disposed between the second channel pattern CP2_3 adjacent to the second word line WL2 and the bit line BL. That is, the first channel patterns CP1_3 disposed on the bit line BL may be disposed to be spaced apart from each other in the second direction (Y direction) with the third insulating pattern 140 interposed between the first channel patterns CP1_3. An end portion CP1_3S of the first channel pattern CP1_3 may be disposed on an upper surface of the bit line BL.

According to some example embodiments shown in FIG. 7, the second insulating pattern 130 and the third insulating pattern 140 may be disposed to further extend in the third direction (Z direction) toward the bit line BL compared with some example embodiments, including the example embodiments shown in FIG. 6. Accordingly, the second insulating pattern 130 may contact the upper surface of the bit line BL, an end portion CP2_3HS of a second channel pattern horizontal portion CP2_3H close to the third insulating pattern 140, and the end portion CP1_3S of the first channel pattern CP1_3 close to the third insulating pattern 140.

Although FIG. 7 illustrates that lower surfaces of the second insulating pattern 130 and the third insulating pattern 140 are disposed at a lower level than an upper surface of the first channel pattern CP1_3, the inventive concepts are not limited thereto.

In some example embodiments, the lower surfaces of the second insulating pattern 130 and the third insulating pattern 140 may be disposed at substantially the same level as or a higher level than the upper surface of the first channel pattern CP1_3.

In addition, the end portion CP1_3S of the first channel pattern CP1_3 close to the third insulating pattern 140 may be aligned on substantially the same boundary as (e.g., coplanar or substantially coplanar with) the end portion CP2_3HS of the second channel pattern horizontal portion CP2_3H close to the third insulating pattern 140. For example, the respective end portions CP1_3S and CP2_3HS of adjacent first and second channel patterns CP1_3 and CP2_3 may be coplanar or substantially coplanar with each other. However, the inventive concepts are not limited thereto.

In some example embodiments, the end portion CP1_3S of the first channel pattern CP1_3 close to the third insulating pattern 140 may not be disposed at the same boundary as the end portion CP2_3HS of the second channel pattern horizontal portion CP2_3H close to the third insulating pattern 140. For example, the end portion CP1_3S of the first channel pattern CP1_3 close to the third insulating pattern 140 may be disposed to protrude more in the second direction (Y direction) than the end portion CP2_3HS of the second channel pattern horizontal portion CP2_3H close to the third insulating pattern 140.

Figure 8:
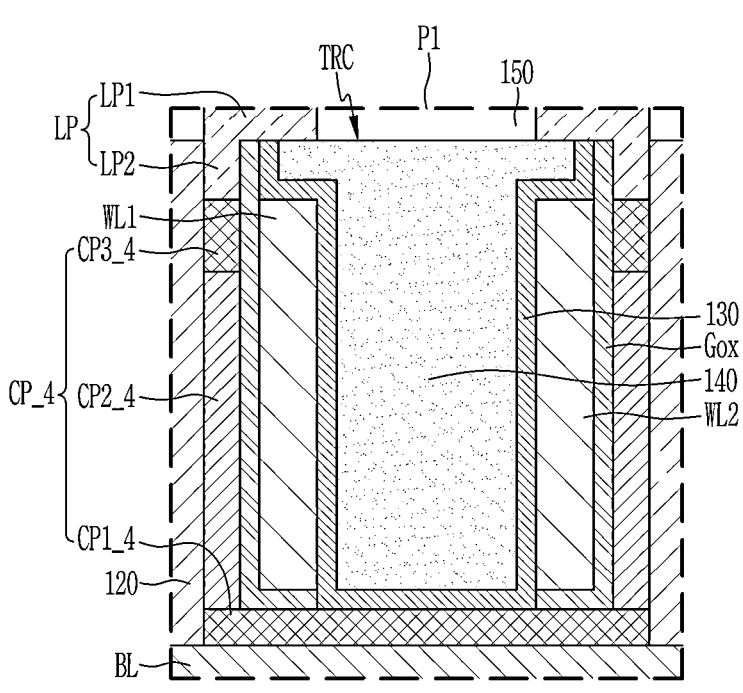
Figure 8:
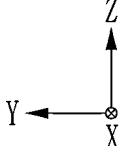

Referring to FIG. 8, unlike some example embodiments, including the example embodiments shown in FIG. 6, a channel pattern CP_4 may include second channel patterns CP2_4 that may be disposed to be spaced apart from each other in the second direction (Y direction) with the word lines WL1 and WL2 interposed between the second channel patterns CP2_4. The channel pattern CP_4 may further include a first channel pattern CP1_4 and a third channel pattern CP3_4.

Specifically, unlike the second channel pattern CP2_2 according to some example embodiments, including the example embodiments shown in FIG. 6, a second channel pattern CP2_4 according to some example embodiments shown in FIG. 8 may not include the second channel pattern horizontal portion CP2_2H extending in the second direction (Y direction).

That is, as shown in FIG. 8, the second channel pattern CP2_4 may extend from both edges of a first channel pattern CP1_4 toward the third direction (Z direction), and the second channel patterns CP2_4 may be disposed to be spaced apart from each other in the second direction (Y direction) with the gate insulating pattern Gox, the word lines WL1 and WL2, the second insulating pattern 130, and the third insulating pattern 140 interposed between the second channel patterns CP2_4.

In addition, according to some example embodiments shown in FIG. 8, unlike some example embodiments shown in FIG. 6, the gate insulating pattern Gox may be disposed to further extend in the third direction (Z direction) toward the bit line BL. Accordingly, the gate insulating pattern Gox may contact an upper surface of the first channel pattern CP1_4.

In FIG. 8, an upper surface of the gate insulating pattern Gox and an upper surface of the second insulating pattern 130 are shown to be disposed at substantially the same level, but the inventive concepts are not limited thereto.

Thus, shapes and dispositions of the channel patterns CP_1, CP_2, CP_3, and CP_4 according to some example embodiments, including the example embodiments illustrated in FIGS. 5 to 8 may be due to a process of forming the channel patterns CP_1, CP_2, CP_3, and CP_4. Accordingly, the shapes and dispositions of the channel patterns CP_1, CP_2, CP_3, and CP_4 are not limited to the example embodiments shown in FIGS. 5 to 8, and may be variously changed.

Even in a case of the semiconductor device according to some example embodiments, including the example embodiments illustrated in FIGS. 5 to 8, the first channel patterns CP1_1, CP1_2, CP1_3, and CP1_4 contacting the bit line BL and the third channel patterns CP3_1, CP3_2, CP3_3, and CP3_4 contacting the landing pad LP may include the crystalline oxide semiconductor.

Accordingly, like the semiconductor device according to some example embodiments, including the example embodiments illustrated in FIG. 3, since contact resistance decreases at interfaces between the first channel patterns CP1_1, CP1_2, CP1_3, and CP1_4 and the bit line BL and interfaces between the third channel patterns CP3_1, CP3_2, CP3_3, and CP3_4 and the landing pad LP, a leakage current may be reduced, and at the same time, interface characteristics of the channel patterns CP_1, CP_2, CP_3, and CP_4 in contact with the bit line BL and the landing pad LP may be improved so that the semiconductor device having excellent performance and operating characteristic is provided.

Hereinafter, a method for manufacturing the semiconductor device will be described with reference to FIGS. 9 to 31. Hereinafter, the same configuration described above will be referred to by the same reference numeral, and redundant description will be omitted or simplified, and a difference will be mainly described.

FIGS. 9 to 24 are cross-sectional views illustrating the method for manufacturing the semiconductor device according to some example embodiments.

Figure 9:
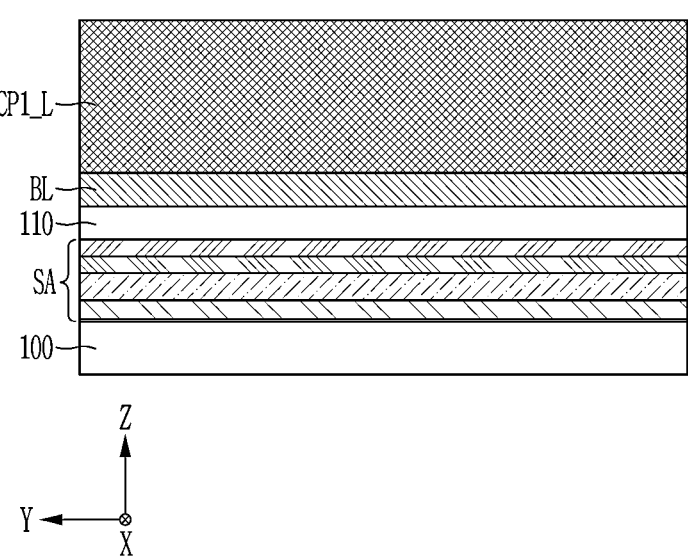
FIGS. 9, 10, 11, 12, 13, 14, 15, 16, 17, 18, 19, 20, 21, 22, 23, and 24 are cross-sectional views illustrating a method for manufacturing the semiconductor device according to some example embodiments.
Figure 10:
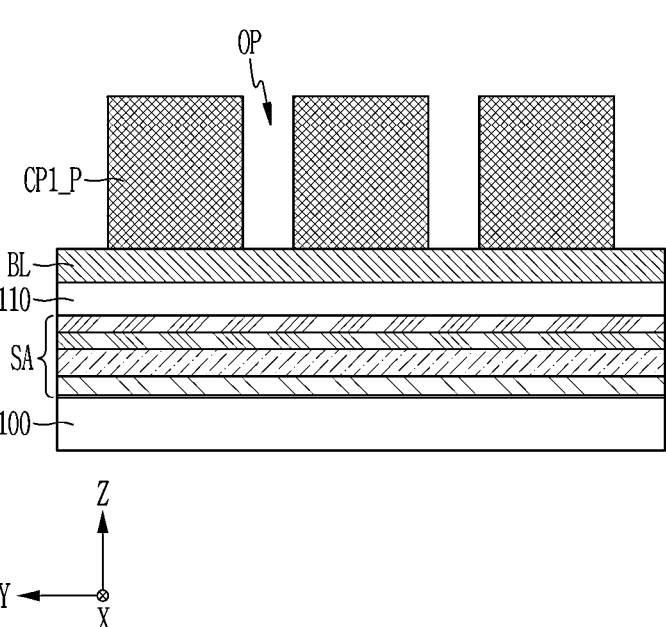

Referring to FIGS. 9 and 10, the NMOS and PMOS transistors that are the core and peripheral circuits SA may be formed on the substrate 100. In addition, the peripheral circuit wires and the peripheral circuit contact plugs electrically connected to the core and peripheral circuits SA may be formed.

Subsequently, the lower insulating layer 110 may be formed above the substrate 100 covering the core and peripheral circuits SA, the peripheral circuit wires, and the peripheral circuit contact plugs. The lower insulating layer 110 may include the insulating films stacked in multiple layers. For example, the lower insulating layer 110 may include the silicon oxide film, the silicon nitride film, the silicon oxynitride film, and/or the low dielectric film.

Subsequently, the bit lines BL extending in the second direction (Y direction) and spaced apart from each other in the first direction (X direction) may be formed on the lower insulating layer 110, and an insulating material may be filled between the bit lines BL. The bit lines BL may be formed by depositing a conductive layer on the lower insulating layer 110 and then patterning the conductive layer.

Next, a first channel pattern material layer CP1_L may be patterned after forming the first channel pattern material layer CP1_L on the bit lines BL so that a first preliminary channel pattern CP1_P extending in the first direction (X direction) and defining openings OP spaced apart from each other in the second direction (Y direction) is formed. The openings OP may cross the bit line BL, and the openings OP may expose an upper surface of the bit line BL.

The first channel pattern material layer CP1_L may include a crystalline oxide semiconductor including at least two materials of In, Ga, Zn, Al, Sn, Hf, and the like. In addition, a material such as Si, Mg, Ta, La, Nd, Ce, Sc, Cr, Co, Nb, Mo, Ba, Gd, Ti, W, Pd, Ru, Ni, Mn, or the like may be further included in the composition. In some example embodiments, since hydrogen (H) is additionally doped to improve crystallinity of the first channel pattern material layer CP1_L, the first channel pattern material layer CP1_L may further include hydrogen (H).

Figure 11:
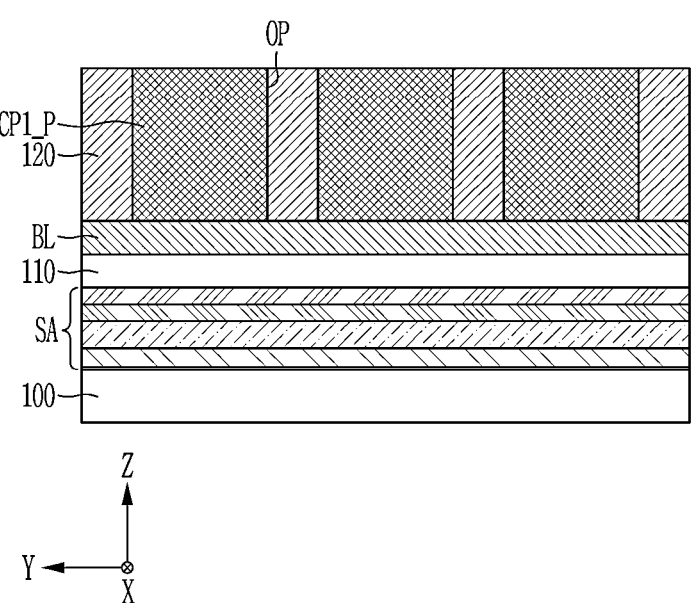

Next, referring to FIG. 11, the first insulating pattern 120 may be formed within the opening OP. That is, the first insulating pattern 120 may expose an upper surface of the first preliminary channel pattern CP1_P, and may fill the opening OP. A process of forming the first insulating pattern 120 within the opening OP may include a process of planarizing the first insulating pattern 120 in which an upper surface of the first insulating pattern 120 is disposed at substantially the same level as an upper surface of the first preliminary channel pattern CP1_P after the first insulating pattern 120 is formed within the opening OP. For example, the planarization process may include a chemical mechanical polishing (CMP) process, but the inventive concepts are not limited thereto and may be variously changed.

For example, the first insulating pattern 120 may be formed of a silicon oxide film, a silicon nitride film, a silicon oxynitride film, and/or a low dielectric film.

Figure 12:
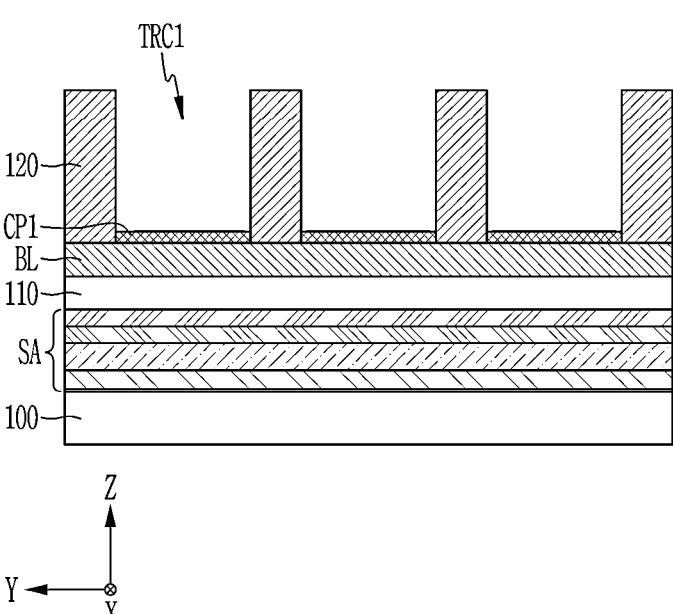

Next, referring to FIG. 12 in addition to FIG. 11, the first channel pattern CP1 may be formed by etching a portion of the first preliminary channel pattern CP1_P. That is, the first channel pattern CP1 may be formed by performing an etching process in which the portion of the first preliminary channel pattern CP1_P is recessed from an upper surface toward a lower surface (e.g., based on etching the first preliminary channel pattern CP1_P to reduce a thickness of the first preliminary channel pattern CP1_P).

In addition, as the portion of the first preliminary channel pattern CP1_P is etched, a first trench TRC1 extending in the third direction (Z direction) may be formed. The first trench TRC1 may be defined by a side surface of the first insulating pattern 120 and an upper surface of the first channel pattern CP1.

In some example embodiments, the etching process may wet etch the portion of the first preliminary channel pattern CP1_P using an etchant that selectively etches the first preliminary channel pattern CP1_P. However, the etching process for recessing the portion of the first preliminary channel pattern CP1_P is not limited thereto and may be variously changed.

Figure 13:
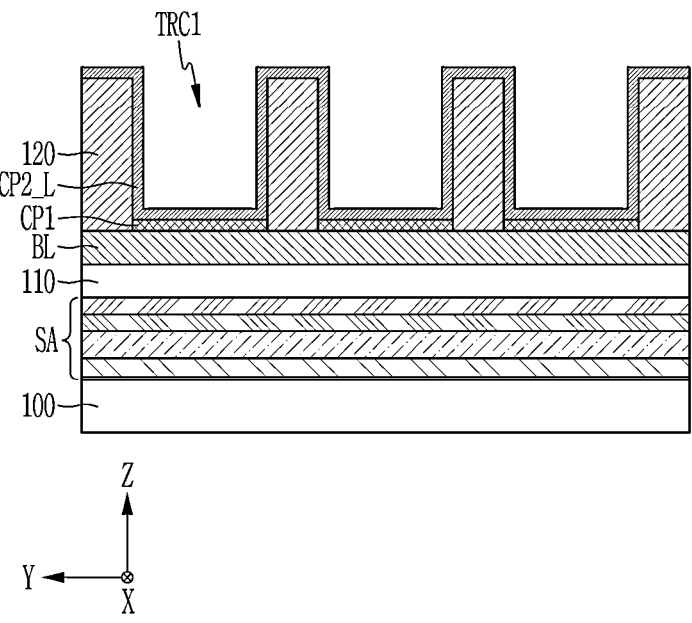
Figure 14:
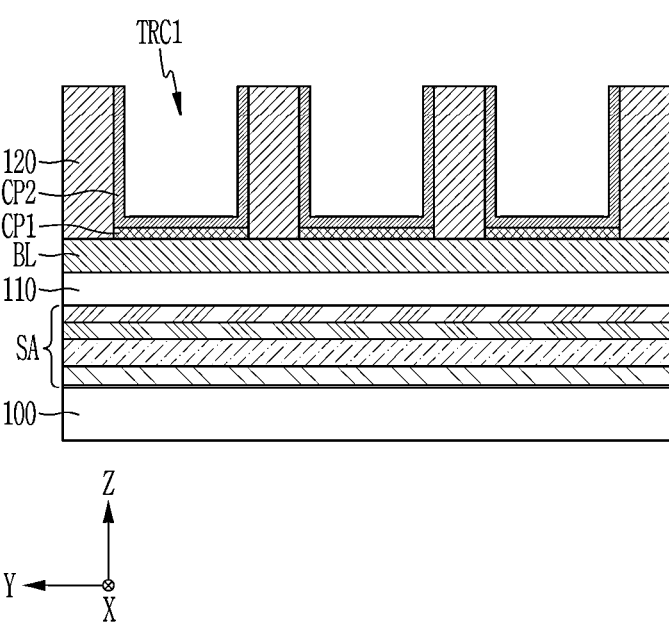

Next, referring to FIGS. 13 and 14, a second channel pattern material layer CP2_L may be formed at upper surfaces of the first insulating patterns 120 and within the first trench TRC1. That is, the second channel pattern material layer CP2_L may be conformally deposited (e.g., formed in a conformal shape) on upper and side surfaces of the first insulating pattern 120 and an upper surface of the first channel pattern CP1. The second channel pattern material layer CP2_L may be formed using at least one of atomic layer deposition (ALD) or physical vapor deposition (PVD) technologies. However, a method of depositing the second channel pattern material layer CP2_L is not limited thereto and may be variously changed.

Next, the second channel pattern material layer CP2_L may be partially removed to form the second channel pattern CP2 within the first trench TRC1. That is, a planarization process may be performed to partially remove the second channel pattern material layer CP2_L (based on etching the second channel pattern material layer CP2_L to reduce a thickness of the channel pattern material layer CP2_L). The second channel pattern CP2 may be a portion of the second channel pattern material layer CP2_L remaining within the first trench TRC1 during the planarization process. The planarization process may be performed until the upper surface of the first insulating pattern 120 is exposed. However, a process of partially removing the second channel pattern material layer CP2_L is not limited thereto and may be variously changed.

The second channel pattern material layer CP2_L may include an amorphous oxide semiconductor including at least two materials of In, Ga, Zn, Al, Sn, Hf, and the like. In addition, a material such as Si, Mg, Ta, La, Nd, Ce, Sc, Cr, Co, Nb, Mo, Ba, Gd, Ti, W, Pd, Ru, Ni, Mn, or the like may be further included in the composition.

In some example embodiments, the second channel pattern material layer CP2_L may include the same material as the first channel pattern material layer CP1_L. That is, the second channel pattern material layer CP2_L may include the same material as the first preliminary channel pattern CP1_P, but a composition ratio of the material of the second channel pattern material layer CP2_L may be different from a composition ratio of the material of the first preliminary channel pattern CP1_P.

However, the inventive concepts are not limited thereto, and in some example embodiments, the second channel pattern material layer CP2_L may include a material different from that of the first channel pattern material layer CP1_L. For example, the second channel pattern material layer CP2_L may have a composition different from that of the first channel pattern material layer CP1_L.

Figure 15:
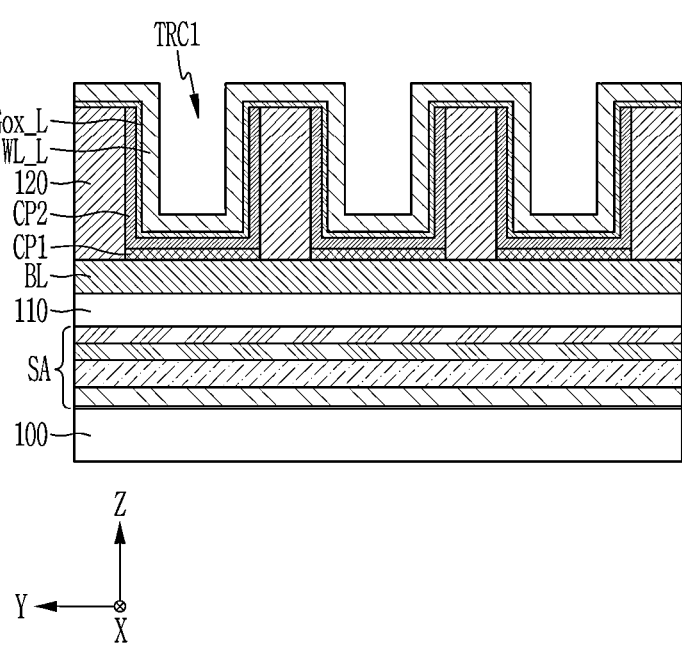
Figure 16:
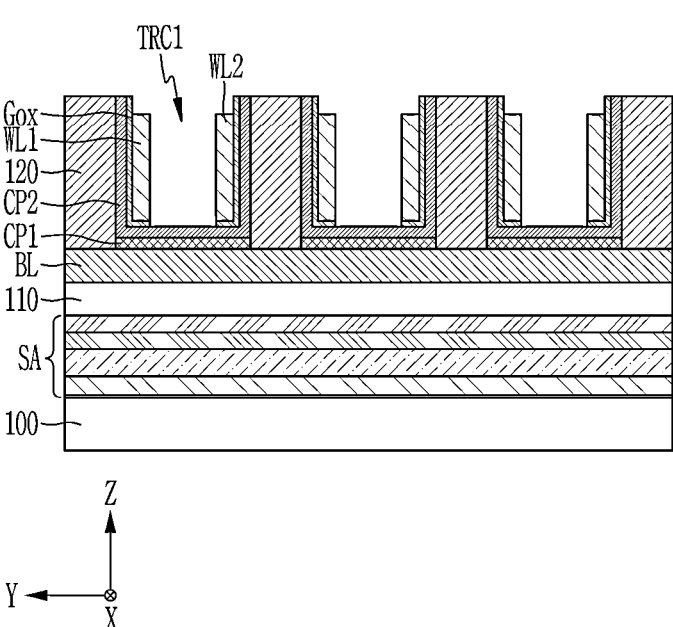

Subsequently, referring to FIGS. 15 and 16, a gate insulating pattern material layer Gox_L and a word line material layer WL_L conformally covering the first insulating pattern 120 and the second channel pattern CP2 may be sequentially deposited.

The gate insulating pattern material layer Gox_L and the word line material layer WL_L may be formed using at least one of physical vapor deposition (PVD), thermal chemical vapor deposition (CVD), low pressure chemical vapor deposition (LP-CVD), plasma enhanced chemical vapor deposition (PE-CVD), or atomic layer deposition (ALD) technologies. However, the method of depositing the gate insulating pattern material layer Gox_L and the word line material layer WL_L is not limited thereto and may be variously changed.

The gate insulating pattern material layer Gox_L may include a silicon oxide, a silicon oxynitride, a high-k material (a high dielectric constant material) having a higher dielectric constant than the silicon oxide, or a combination thereof.

The word line material layer WL_L may include a doped polysilicon, a metal, a conductive metal nitride, a conductive metal silicide, a conductive metal oxide, or a combination thereof.

Subsequently, the gate insulating pattern material layer Gox_L and the word line material layer WL_L may be cut to form the gate insulating pattern Gox and the word lines WL1 and WL2 within the first trench TRC1.

Specifically, an anisotropic etching process may be performed on the word line material layer WL_L to form a pair of word lines WL1 and WL2 separated from each other in the second direction (Y direction) within the first trench TRC1. In addition, gate insulating pattern material layers Gox_L spaced apart from each other in the second direction (Y direction) may be formed within the first trench TRC1.

During the anisotropic etching process for the word line material layer WL_L, upper surfaces of the word lines WL1 and WL2 may be lower than an upper surface of the second channel pattern CP2. Unlike this, in some example embodiments, an etching process may be additionally performed to recess the upper surfaces of the word lines WL1 and WL2.

In some example embodiments, a process of cutting the gate insulating pattern material layer Gox_L may be performed simultaneously with cutting the word line material layer WL_L. In this case, one end of each gate insulating pattern Gox may be continuous with side surfaces of corresponding word lines WL1 and WL2.

Figure 17:
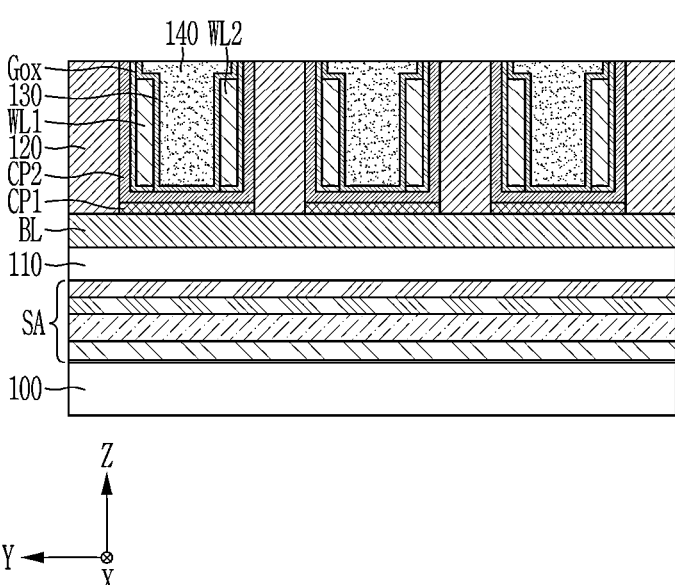

Next, referring to FIG. 17, the second insulating pattern 130 and the third insulating pattern 140 filling the first trench TRC1 may be formed above or on the gate insulating pattern Gox and the word lines WL1 and WL2.

Specifically, the second insulating pattern 130 may be conformally formed (e.g., formed in a conformal shape) along profiles of the gate insulating pattern Gox, the word lines WL1 and WL2, and the second channel pattern CP2 within the first trench TRC1.

A method of depositing the second insulating pattern 130 may be formed using at least one of physical vapor deposition (PVD), thermal chemical vapor deposition (CVD), low pressure chemical vapor deposition (LP-CVD), plasma enhanced chemical vapor deposition (PE-CVD), or atomic layer deposition (ALD) technologies. However, the method of depositing the second insulating pattern 130 is not limited thereto and may be variously changed.

Subsequently, the third insulating pattern 140 filling the first trench TRC1 remaining after the second insulating pattern 130 is formed may be formed.

A process of forming the second insulating pattern 130 and the third insulating pattern 140 may include a planarization process of exposing an upper surface of the first insulating pattern 120, an upper surface of the second channel pattern CP2, and an upper surface of the gate insulating pattern Gox. That is, the second insulating pattern 130 and the third insulating pattern 140 may be portions of the second insulating pattern 130 and the third insulating pattern 140 remaining within the first trench TRC1 during the planarization process. In other words, the second insulating pattern 130 and the third insulating pattern 140 disposed at a higher level than the upper surface of the first insulating pattern 120, the upper surface of the second channel pattern CP2, and the upper surface of the gate insulating pattern Gox may be removed by the planarization process.

Figure 18:
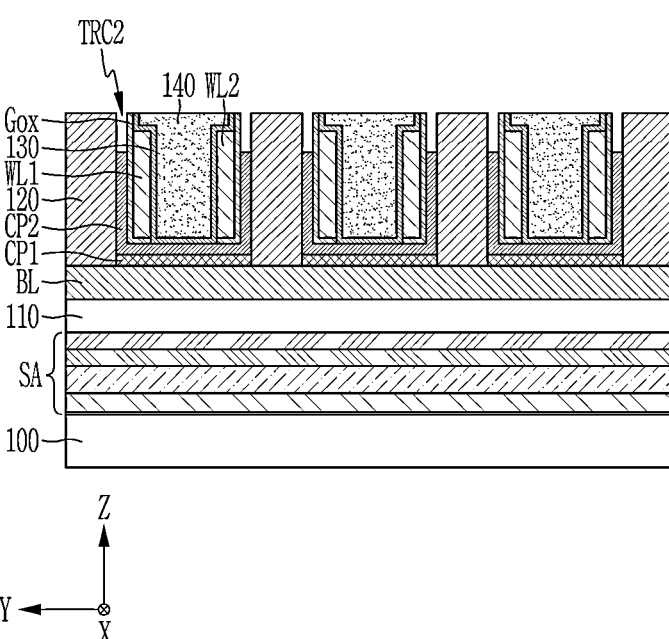
Figure 19:
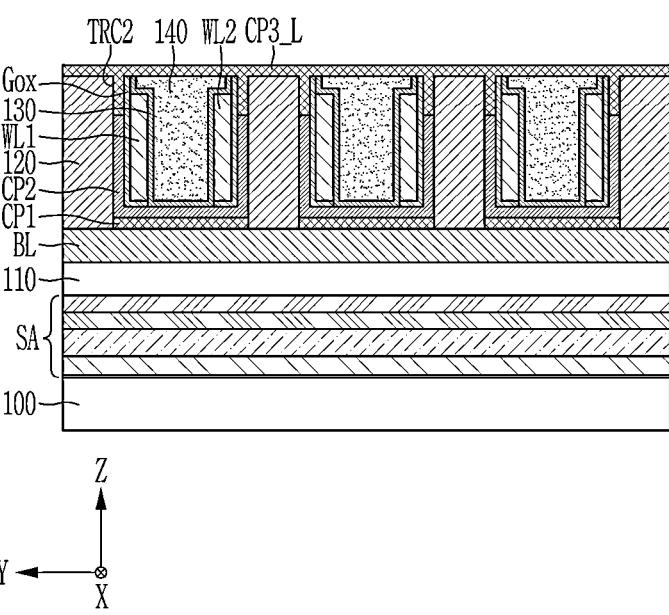
Figure 20:
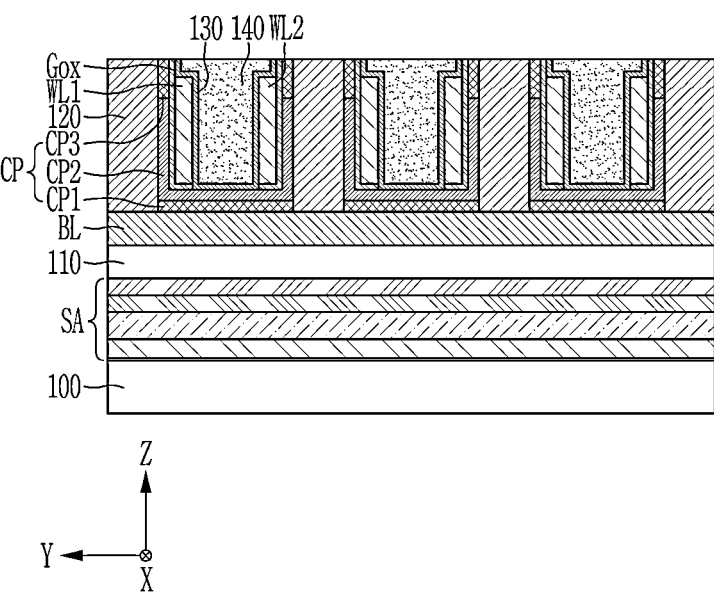

Next, referring to FIGS. 18 to 20, the third channel pattern CP3 may be formed at an end portion of the second channel pattern CP2.

First, referring to FIG. 18, a second trench TRC2 may be formed through an etching process in which a portion of the second channel pattern CP2 is recessed.

Specifically, the second trench TRC2 extending in the third direction (Z direction) may be formed by wet etching the second channel pattern CP2 from an upper surface toward a lower surface (e.g., etching the second channel pattern CP2 to reduce a thickness of the second channel pattern CP2 in the Z direction).

In some example embodiments, a portion of the second channel pattern CP2 may be wet-etched using an etchant that selectively etches the second channel pattern CP2. However, the etching process for recessing the second channel pattern CP2 is not limited thereto and may be variously changed.

Next, referring to FIG. 19, a third channel pattern material layer CP3_L that covers upper surfaces of the insulating patterns 120, 130, and 140 and an upper surface of the gate insulating pattern Gox and fills the second trench TRC2, may be formed.

In some example embodiments, the third channel pattern material layer CP3_L may include a crystalline oxide semiconductor including the same material as the above-described first channel pattern material layer CP1_L. However, the inventive concepts are not limited thereto, and in some example embodiments, the third channel pattern material layer CP3_L may include a crystalline oxide semiconductor including a material that is different from that of the first channel pattern material layer CP1_L.

Subsequently, referring to FIG. 20, a portion of the third channel pattern material layer CP3_L may be removed to form the third channel pattern CP3 within the second trench TRC2.

Specifically, a planarization process may be performed to remove the third channel pattern material layer CP3_L disposed at a higher level than the upper surfaces of the insulating patterns 120, 130, and 140 and the upper surface of the gate insulating pattern Gox. The third channel pattern CP3 may be a part of the third channel pattern material layer CP3_L remaining in the second trench TRC2 during the planarization process. The planarization process may be performed until the upper surfaces of the insulating patterns 120, 130, and 140 and the upper surface of the gate insulating pattern Gox are exposed.

In some example embodiments, after the third channel pattern material layer CP3_L is formed within the second trench TRC2, the planarization process may be performed to remove the third channel pattern material layer CP3_L disposed at a higher level than the upper surfaces of the insulating patterns 120, 130, and 140 and the upper surface of the gate insulating pattern Gox within the second trench TRC2, so that the third channel pattern CP3 is formed.

Figure 21:
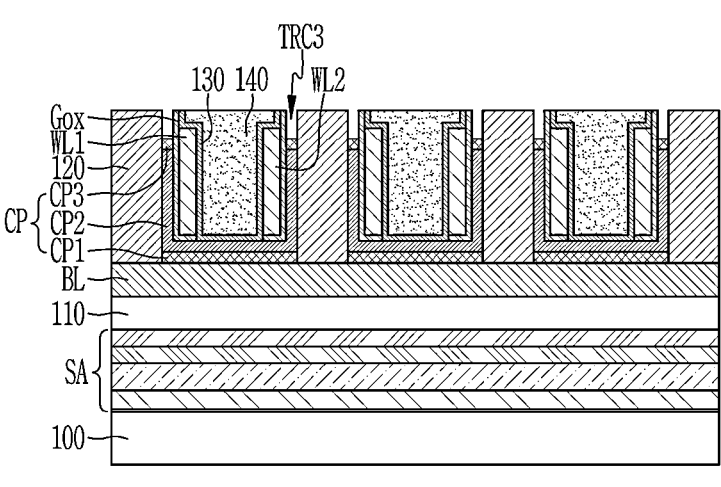

Subsequently, referring to FIG. 21, a third trench TRC3 may be formed through an etching process in which a portion of the third channel pattern CP3 is recessed.

Specifically, the third trench TRC3 extending in the third direction (Z direction) may be formed by wet etching the third channel pattern CP3 from an upper surface toward a lower surface.

Accordingly, an upper surface of the third channel pattern CP3 may be disposed at a lower level than upper surfaces of the word lines WL1 and WL2.

In some example embodiments, a portion of the third channel pattern CP3 may be wet-etched using an etchant that selectively etches the third channel pattern CP3. However, the etching process for recessing the third channel pattern CP3 is not limited thereto and may be variously changed.

Figure 22:
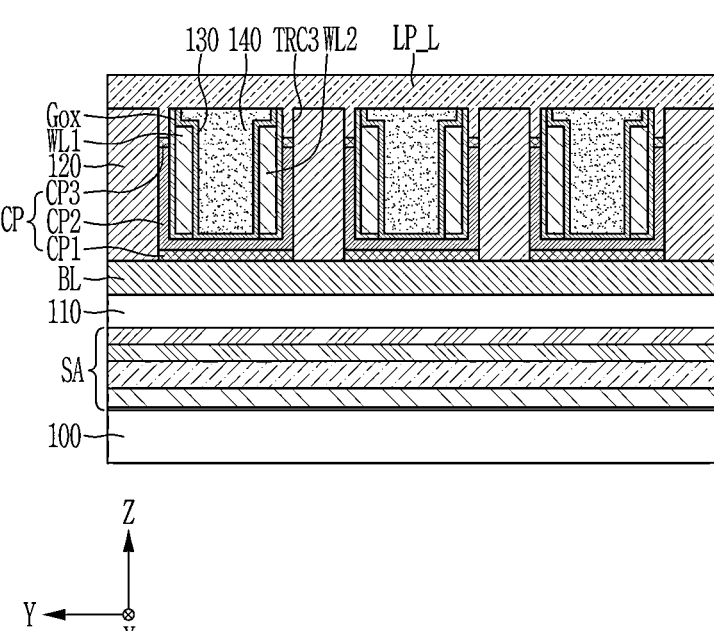

Next, referring to FIG. 22, a landing pad material layer LP_L may be formed on the insulating patterns 120, 130, and 140, the gate insulating pattern Gox, and the channel pattern CP. In this process, the landing pad material layer LP_L may contact the upper surface of the third channel pattern CP3 while filling the third trench TRC3.

Figure 23:
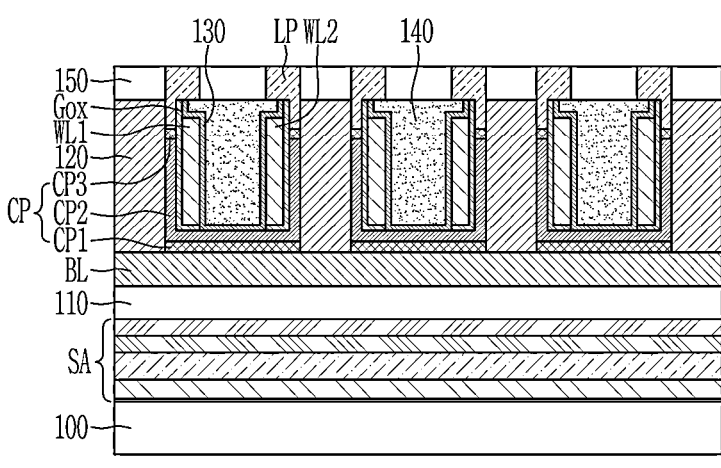
Figure 23:
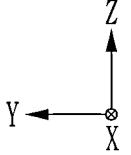

Next, referring to FIG. 23 in addition to FIG. 22, after the landing pad material layer LP_L is patterned to form holes exposing upper surfaces of the first insulating pattern 120 and the third insulating pattern 140, the interlayer insulating layer 150 may be filled within the holes, and then a planarization process may be performed. However, an order of forming the landing pads LP and the interlayer insulating layer 150 is not limited thereto, and in some example embodiments, the interlayer insulating layer 150 may be formed and patterned on the insulating patterns 120, 130, and 140, the gate insulating pattern Gox, and the channel pattern CP, and then the landing pads LP penetrating the interlayer insulating layer 150 may be formed.

Figure 24:
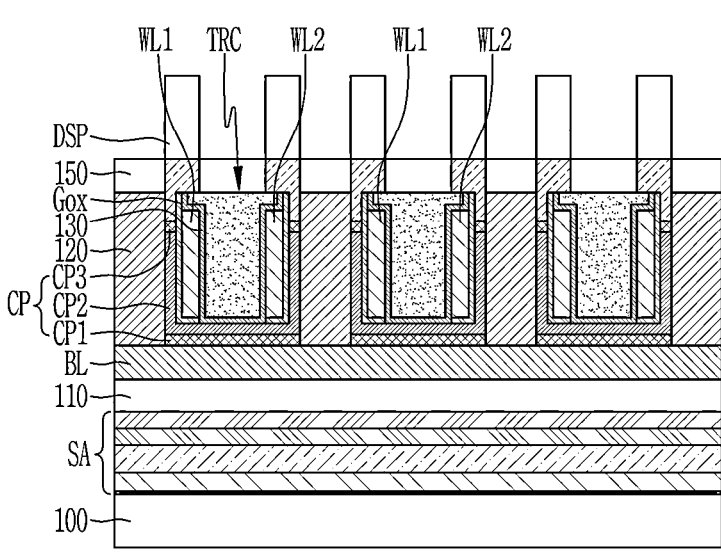
Figure 24:
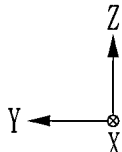

Next, referring to FIG. 24, the data storage patterns DSP may be respectively formed on the landing pads LP. In some example embodiments, when the data storage patterns DSP include capacitors, lower electrodes, a capacitor dielectric film, and an upper electrode may be sequentially formed.

FIGS. 25 to 31 are cross-sectional views illustrating the method for manufacturing the semiconductor device according to some example embodiments.

Figure 25:
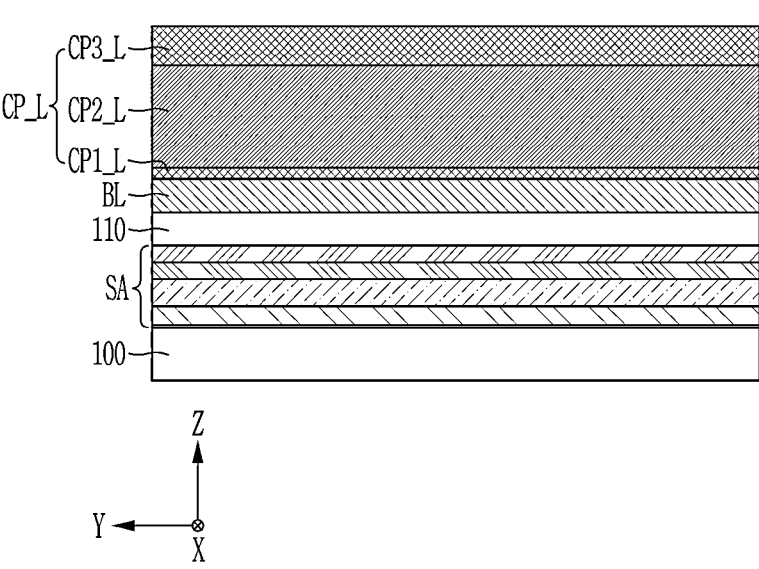

Referring to FIG. 25, a channel pattern material layer CP_L may be formed on the bit lines BL. The channel pattern paint layer CP_L may include a first channel pattern material layer CP1_L, a second channel pattern material layer CP2_L, and a third channel pattern material layer CP3_L sequentially stacked from an upper surface of the bit line BL.

The first channel pattern material layer CP1_L, the second channel pattern material layer CP2_L, and the third channel pattern material layer CP3_L may have different thicknesses. For example, a thickness of the second channel pattern material layer CP2_L may be greater than a thickness of the first channel pattern material layer CP1_L and a thickness of the third channel pattern material layer CP3_L, and the thickness of the third channel pattern material layer CP3_L may be greater than the thickness of the first channel pattern material layer CP1_L. However, the inventive concepts are not limited thereto, and the thicknesses of the first channel pattern material layer CP1_L, the second channel pattern material layer CP2_L, and the third channel pattern material layer CP3_L may be variously changed.

The first channel pattern material layer CP1_L, the second channel pattern material layer CP2_L, and the third channel pattern material layer CP3_L include at least two materials of In, Ga, Zn, Al, Sn, Hf, and the like. In addition, a material such as Si, Mg, Ta, La, Nd, Ce, Sc, Cr, Co, Nb, Mo, Ba, Gd, Ti, W, Pd, Ru, Ni, Mn, or the like may be further included in the composition. The first channel pattern material layer CP1_L and the third channel pattern material layer CP3_L may include a crystalline oxide semiconductor, and the second channel pattern material layer CP2_L may include an amorphous oxide semiconductor.

Figure 26:
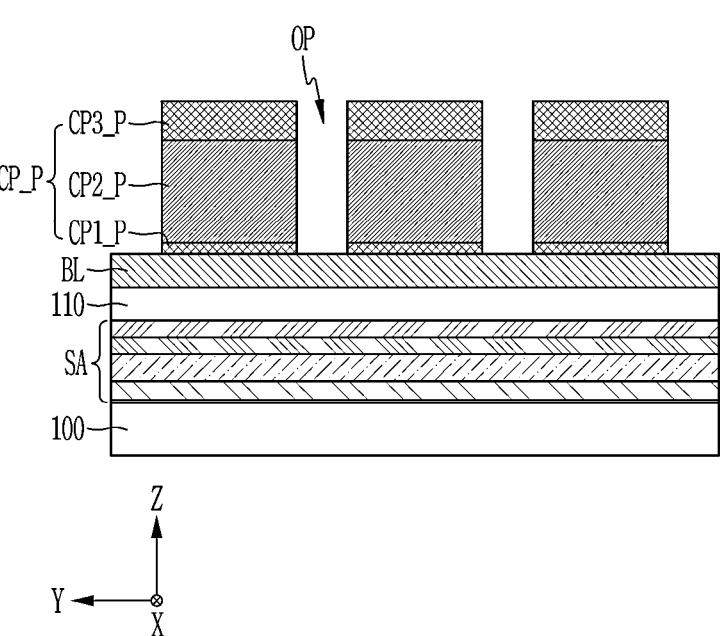

Next, referring to FIG. 26, the channel pattern material layer CP_L may be patterned so that a preliminary channel pattern CP_P extending in the first direction (X direction) and defining openings OP spaced apart from each other in the second direction (Y direction) is formed. The preliminary channel pattern CP_P may include a first preliminary channel pattern CP1_P, a second preliminary channel pattern CP2_P, and a third preliminary channel pattern CP3_P sequentially stacked from an upper surface of the bit line BL.

Figure 27:
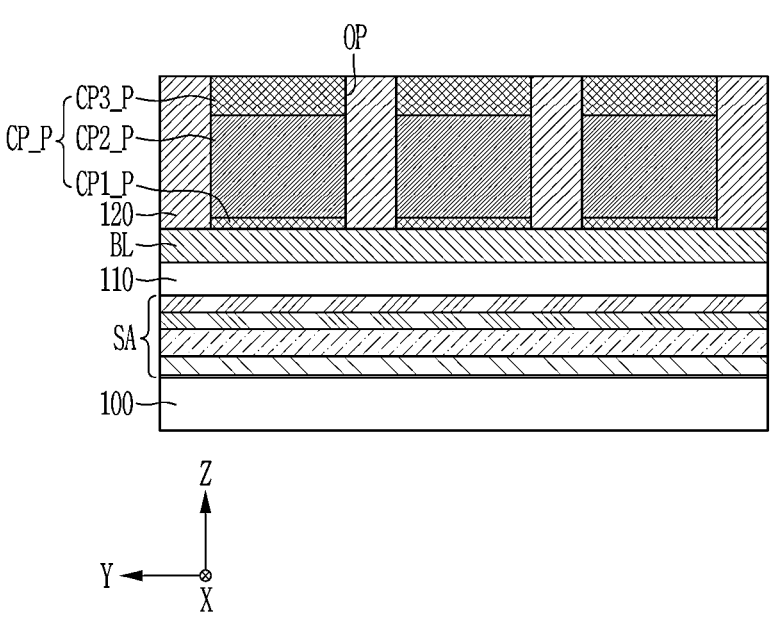

Next, referring to FIG. 27, a first insulating pattern 120 may be formed within the opening OP. That is, the first insulating pattern 120 may expose an upper surface of the preliminary channel pattern CP_P, and may fill the opening OP. A planarization process of removing a portion of the first insulating pattern 120 may be included so that an upper surface of the first insulating pattern 120 is disposed at substantially the same level as the upper surface of the preliminary channel pattern CP_P.

Subsequently, referring to FIG. 28A together with FIG. 27, the preliminary channel pattern CP_P may be patterned so that a first trench TRC1 and a channel pattern CP extending in the third direction (Z direction) is formed. That is, the preliminary channel pattern CP_P may be patterned to form the channel pattern CP including a first channel pattern CP1 disposed on the bit line BL, a second channel pattern CP2 that is disposed on the first channel pattern CP1 and includes a horizontal portion extending in the second direction (Y direction) parallel to an upper surface of the bit line BL and a vertical portion extending in the third direction (Z direction) perpendicular to the upper surface of the bit line BL, and a third channel pattern CP3 disposed at an end portion of the second channel pattern CP2.

As the second channel pattern CP2 and the third channel pattern CP3 are simultaneously formed by patterning the preliminary channel pattern CP_P, a side surface of the second channel pattern CP2 may be continuous with a side surface of the third channel pattern CP3.

The first trench TRC1 may be formed by removing portions of the second preliminary channel pattern CP2_P and the third preliminary channel pattern CP3_P, and the first trench TRC1 may be defined by the side surface of the second channel pattern CP2, the side surface of the third channel pattern CP3, and an upper surface of the second channel pattern CP2 disposed between side surfaces of the second channel pattern CP2. However, a process of patterning the preliminary channel pattern CP_P is not limited to the example embodiments shown in FIG. 28A.

Figure 28A:
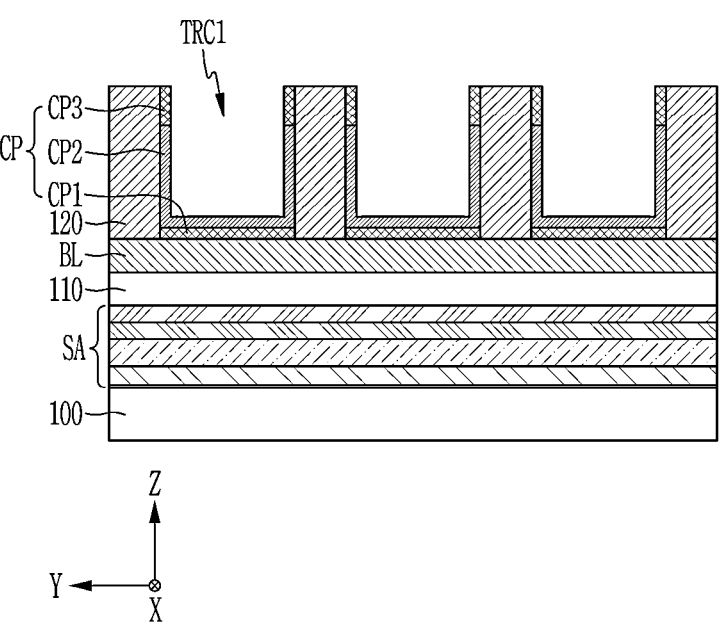
Figure 28B:
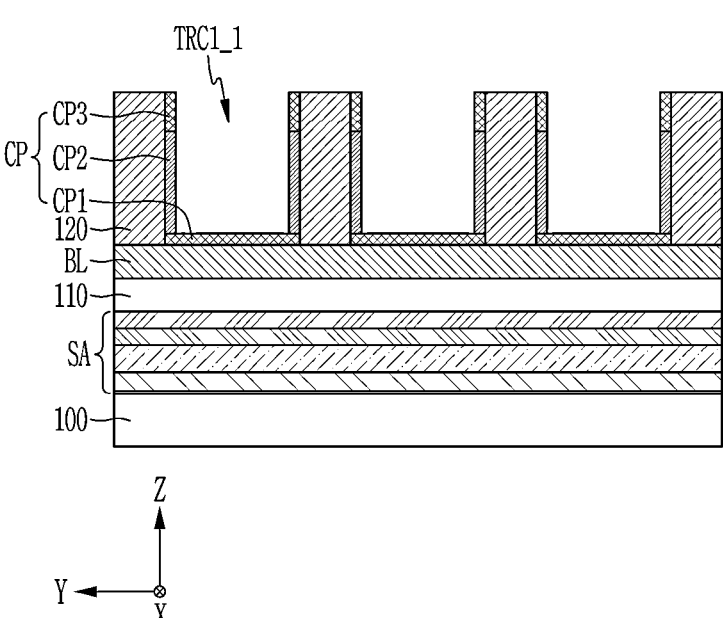

For example, as in some example embodiments including the example embodiments shown in FIG. 28B, the preliminary channel pattern CP_P may be patterned to form the channel pattern CP including a first channel pattern CP1 disposed on the bit line BL, second channel patterns CP2 that are disposed on the first channel pattern CP1, extend in the third direction (Z direction) perpendicular to an upper surface of the bit line BL, and are spaced apart from each other in the second direction (Y direction), and a third channel pattern CP3 disposed at an end portion of the second channel pattern CP2. That is, when the preliminary channel pattern CP_P is patterned as in some example embodiments including the example embodiments shown in FIG. 28B, the channel pattern CP_4 according to some example embodiments including the example embodiments shown in FIG. 8 may be formed.

Unlike FIG. 28A, a first trench TRC1-1 according to some example embodiments including the example embodiments shown in FIG. 28B may expose an upper surface of the first channel pattern CP1, and the first trench TRC1-1 may be defined by the upper surface of the first channel pattern CP1, a side surface of the second channel pattern CP2, and a side surface of the third channel pattern CP3.

Hereinafter, a subsequent process will be described based on some example embodiments of FIG. 28A.

Figure 29:
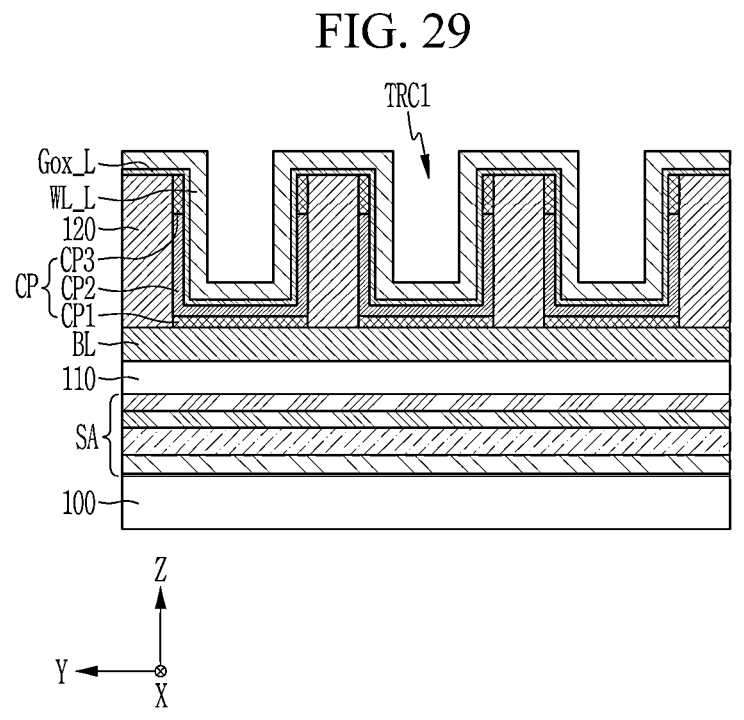
Figure 30:
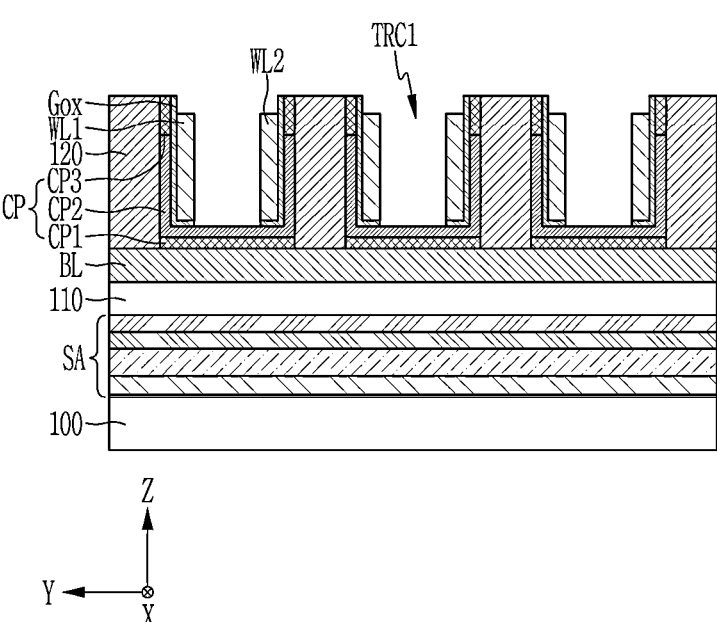

Subsequently, referring to FIGS. 29 and 30, the gate insulating pattern material layer Gox_L and the word line material layer WL_L conformally covering the first insulating pattern 120 and the channel pattern CP may be sequentially deposited.

Subsequently, the gate insulating pattern material layer Gox_L and the word line material layer WL_L may be cut to form the gate insulating pattern Gox and the word lines WL1 and WL2 within the first trench TRC1.

Figure 31:
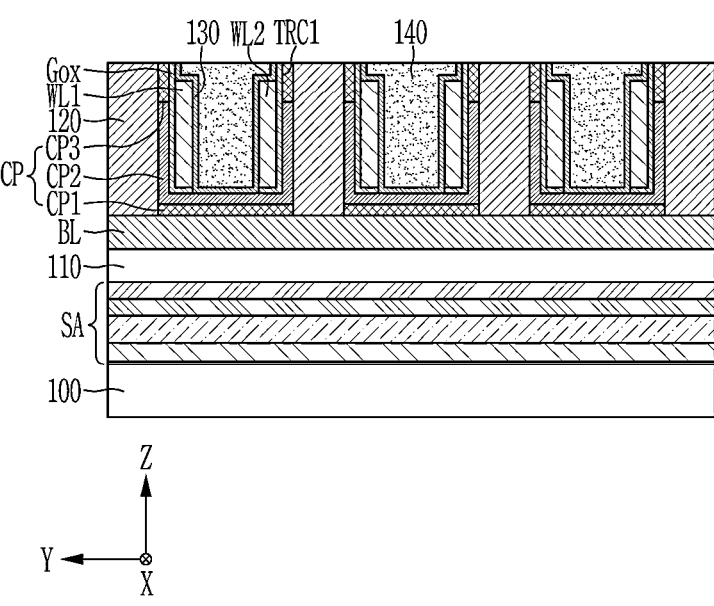

Next, referring to FIG. 31, the second insulating pattern 130 and the third insulating pattern 140 filling the first trench TRC1 may be formed on the gate insulating pattern Gox and the word lines WL1 and WL2.

Thereafter, referring to FIGS. 20 to 24, the semiconductor device may be completed through the above-described process.

While this inventive concepts have been described in connection with what is considered to be practical example embodiments, it is to be understood that the inventive concepts are not limited to such example embodiments, but, on the contrary, are intended to cover various modifications and equivalent arrangements included within the spirit and scope of the appended claims.

What is claimed is:

1. A semiconductor device, comprising:
a substrate;
a bit line above the substrate;
a channel pattern that is on the bit line and extends in a direction perpendicular to an upper surface of the bit line;
a word line that intersects the bit line and is spaced apart from the channel pattern;
a gate insulating pattern between the channel pattern and the word line;
an insulating pattern on the word line; and
a landing pad connected to the channel pattern,
wherein the channel pattern includes a first channel pattern, a second channel pattern, and a third channel pattern that are sequentially stacked, the first channel pattern is connected to the bit line, the second channel pattern is between the first channel pattern and the third channel pattern, the third channel pattern is connected to the landing pad, the first channel pattern and the third channel pattern include a crystalline oxide semiconductor material, and the second channel pattern includes an amorphous oxide semiconductor material.

2. The semiconductor device of claim 1, wherein the first channel pattern contacts the bit line, and the third channel pattern is in contact with the landing pad.

3. The semiconductor device of claim 2, wherein the second channel pattern includes a horizontal portion and a first vertical portion and a second vertical portion extending in a vertical direction from opposite end portions of the horizontal portion, a lower surface of the horizontal portion of the second channel pattern is in contact with an upper surface of the first channel pattern, and upper surfaces of the first vertical portion and the second vertical portion of the second channel pattern each contact a lower surface of the third channel pattern.

4. The semiconductor device of claim 1, wherein an upper surface of the third channel pattern is at a different level from an upper surface of the word line.

5. The semiconductor device of claim 1, wherein an upper surface of the third channel pattern is at substantially a same level as an upper surface of the word line.

6. The semiconductor device of claim 1, wherein at least one of the first channel pattern, the second channel pattern, or the third channel pattern includes a different material than at least one other pattern of the first channel pattern, the second channel pattern, or the third channel pattern.

7. The semiconductor device of claim 6, wherein the second channel pattern includes a material that is different from a material of the first channel pattern and the third channel pattern.

8. The semiconductor device of claim 1, wherein at least one of the first channel pattern, the second channel pattern, or the third channel pattern has a different thickness than at least one other pattern of the first channel pattern, the second channel pattern, or the third channel pattern.

9. The semiconductor device of claim 1, wherein the crystalline oxide semiconductor material and the amorphous oxide semiconductor material include at least two of In, Ga, Zn, Al, Mg, Sn, Si, or O.

10. The semiconductor device of claim 1, wherein:
each of the first channel pattern, the second channel pattern, and the third channel pattern includes a first material,
a composition ratio of the first material in the first channel pattern and a composition ratio of the first material in the third channel pattern are each higher than a composition ratio of the first material in the second channel pattern, and
the first material is at least one of In, Ga, or H.

11. The semiconductor device of claim 1, wherein:
the second channel pattern includes a first portion extending in a first direction and a second portion extending from the first portion in a second direction crossing the first direction,
the first channel pattern has a first length in the second direction, the second portion of the second channel pattern has a second length in the second direction,
the third channel pattern has a third length in the second direction, and
the second length is longer than the first length and the third length.

12. The semiconductor device of claim 11, wherein the first length is different from the third length.

13. A semiconductor device, comprising:
a substrate;
a bit line above the substrate;
a first insulating pattern on the bit line;
a channel pattern on an upper surface of the bit line and on a side surface of the first insulating pattern;
a word line that crosses the bit line and is spaced apart from the channel pattern;
a gate insulating pattern between the channel pattern and the word line;
a second insulating pattern on the word line; and
a landing pad connected to the channel pattern,
wherein:
the channel pattern includes a first channel pattern, second channel patterns, and a third channel pattern that are sequentially stacked,
the first channel pattern is connected to the bit line,
the second channel patterns are between the first channel pattern and the third channel pattern,
the second channel patterns are separated from each other with the second insulating pattern between the second channel patterns, the third channel pattern is connected to the landing pad,
the first channel pattern and the third channel pattern include a crystalline oxide semiconductor material, and
the second channel patterns include an amorphous oxide semiconductor material.

14. The semiconductor device of claim 13,
wherein the second insulating pattern is in contact with:
an upper surface of the first channel pattern, and
respective end portions of each of the second channel patterns on the first channel pattern.

15. The semiconductor device of claim 13, wherein:
the channel pattern includes first channel patterns, the first channel patterns including the first channel pattern, the first channel patterns spaced apart from each other with the second insulating pattern between adjacent first channel patterns of the first channel patterns, and
the second insulating pattern contacts an end portion of each of the first channel patterns on the upper surface of the bit line and the upper surface of the bit line.

16. The semiconductor device of claim 15, wherein respective end portions of adjacent first and second channel patterns are substantially coplanar with each other.

17. The semiconductor device of claim 13, wherein the crystalline oxide semiconductor material and the amorphous oxide semiconductor material include at least two of In, Ga, Zn, Al, Mg, Sn, Si, or O.

18. A method for manufacturing a semiconductor device, the method comprising:
forming a bit line above a substrate;
forming a channel pattern in which a first channel pattern, a second channel pattern, and a third channel pattern are sequentially stacked on the bit line;
forming a gate insulating pattern on the channel pattern;
forming a word line parallel to the channel pattern on the gate insulating pattern; and
forming a landing pad connected to the channel pattern,
wherein:
the first channel pattern is connected to the bit line,
the second channel pattern is between the first channel pattern and the third channel pattern,
the third channel pattern is connected to the landing pad,
the first channel pattern and the third channel pattern include a crystalline oxide semiconductor material, and
the second channel pattern includes an amorphous oxide semiconductor material.

19. The method of claim 18, wherein the forming of the channel pattern comprises:
forming a first channel pattern material layer including the crystalline oxide semiconductor material on the bit line;
patterning the first channel pattern material layer and forming an insulating pattern covering a side surface of the first channel pattern material layer;
forming the first channel pattern based on etching the first channel pattern material layer to reduce a thickness of the first channel pattern material layer;
forming a second channel pattern material layer including the amorphous oxide semiconductor material in a conformal shape on an upper surface of the first channel pattern and on a side surface of the insulating pattern;
forming the second channel pattern based on etching the second channel pattern material layer to reduce a thickness of the second channel pattern material layer subsequently to forming the gate insulating pattern and the word line on the second channel pattern material layer; and
forming the third channel pattern including the crystalline oxide semiconductor material on the second channel pattern.

20. The method of claim 18, wherein the forming of the channel pattern comprises:
forming a channel material layer based on sequentially stacking a first channel pattern material layer including the crystalline oxide semiconductor material, a second channel pattern material layer including the amorphous oxide semiconductor material, and a third channel pattern material layer including the crystalline oxide semiconductor material on the bit line;

patterning the channel material layer and forming an insulating pattern covering a side surface of the channel material layer; and forming the first channel pattern on the bit line, the second channel pattern on the first channel pattern and extending in a direction perpendicular to an upper surface of the bit line, and the third channel pattern on an upper surface of the second channel pattern.

* * * * *